(12) United States Patent
Chen et al.

(10) Patent No.: US 12,132,477 B2
(45) Date of Patent: Oct. 29, 2024

(54) CMOS SCHMITT TRIGGER RECEIVER FOR THIN OXIDE TECHNOLOGY

(71) Applicant: Taiwan Semiconductor Manufacturing Company, Ltd., Hsinchu (TW)

(72) Inventors: Yung-Shun Chen, Taoyuan (TW); Chih-Chiang Chang, Taipei (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/448,008

(22) Filed: Aug. 10, 2023

(65) Prior Publication Data

US 2024/0088892 A1 Mar. 14, 2024

Related U.S. Application Data

(62) Division of application No. 17/581,589, filed on Jan. 21, 2022.

(51) Int. Cl.
*H03K 17/687* (2006.01)
*H03K 19/0175* (2006.01)
*H03K 19/0185* (2006.01)
*H03K 19/20* (2006.01)

(52) U.S. Cl.
CPC ..... *H03K 17/6872* (2013.01); *H03K 17/6874* (2013.01); *H03K 19/017509* (2013.01); *H03K 19/018521* (2013.01); *H03K 19/20* (2013.01)

(58) Field of Classification Search
CPC .... H03K 3/02337; H03K 3/0377; H03K 3/13; H03K 3/2893; H03K 3/3565; H03K 17/687; H03K 17/6871; H03K 17/6872; H03K 17/6874; H03K 19/00369; H03K 19/00384; H03K 19/0175; H03K 19/017509; H03K 19/0185; H03K 19/018507; H03K 19/018521
See application file for complete search history.

(56) References Cited

U.S. PATENT DOCUMENTS

| | | | |
|---|---|---|---|
| 9,496,874 B2 | 11/2016 | Kim | |
| 10,483,973 B2 | 11/2019 | Chen et al. | |
| 11,444,611 B2* | 9/2022 | Ma | H03K 19/018521 |
| 2016/0105183 A1* | 4/2016 | Kim | H03K 19/00315 |
| | | | 327/333 |
| 2023/0238956 A1* | 7/2023 | Chen | H03K 17/6874 |
| | | | 327/205 |

* cited by examiner

*Primary Examiner* — Long Nguyen
(74) *Attorney, Agent, or Firm* — MERCHANT & GOULD P.C.

(57) ABSTRACT

A device including an inverter circuit, a hysteresis control circuit, and a high-side input level shifter. The inverter circuit having an output and including at least two series connected PMOS transistors connected, at the output, in series to at least two series connected NMOS transistors. The hysteresis control circuit coupled to the output to provide feedback to the at least two series connected PMOS transistors and to the at least two series connected NMOS transistors. The high-side input level shifter connected to gates of the at least two PMOS transistors and configured to shift a low level of an input signal to a higher level and provide the higher level to one or more of the gates of the at least two PMOS transistors.

20 Claims, 11 Drawing Sheets

| | Hi-side (PFETs) | Typical | Max. |
|---|---|---|---|
| 140 | VDDIO | 1.05 | 1.26 (1.2x) |
| 144 | Delta | 0.6   1.28x | 0.765 |
| 142 | VSSH | 0.45 | 0.495 (1.1x) |

| | Lo-side (NFETs) | Typical | Max. |
|---|---|---|---|
| 146 | VDDC | 0.75 | 0.825 (1.1x) |
| 150 | Delta | 0.75   1.1x | 0.825 |
| 148 | VSS | 0 | 0 |

FIG. 5

CMOS SCHMITT TRIGGER RECEIVER FOR THIN OXIDE TECHNOLOGY

CROSS REFERENCE

This application is a divisional of U.S. patent application Ser. No. 17/581,589 filed Jan. 21, 2022, the entire disclosure of which is hereby incorporated by reference.

BACKGROUND

Often, CMOS technology incorporates thick oxide devices and thin oxide devices on the same die. Typically, the thick oxide devices are used in analog circuits, input/output (I/O) circuits, and electro-static discharge (ESD) control circuits, and the thin oxide devices are used in analog circuits and logic circuits in the core of the device. The thick oxide devices are used in I/O circuits that receive an I/O power supply voltage VDDIO used for transmitting and receiving I/O signals, and the thin oxide devices are used in the core of the device that receives a device core power supply voltage VDDC that is less than the I/O power supply voltage VDDIO.

Integration of the thick oxide devices and the thin oxide devices fulfills the demands of the device, including the I/O circuits, the ESD control circuits, and the core logic circuits. However, in the evolutionary path of field-effect transistors (FETs), from planar FETs to FinFETs and on to gate-all-around FETs (GAAFETs) and multi-bridge-channel FETs (MBCFETs), integration of the thick oxide devices and the thin oxide devices on the same die becomes increasingly difficult. In at least some situations, such as in GAAFET and MBCFET technologies, fabricating the thick oxide devices and the thin oxide devices on the same die is not allowed. Also, fabricating the thick oxide devices and the thin oxide devices on the same die is more costly due to extra masks and larger layout areas that include a keep out zone between the thick oxide devices and the thin oxide devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 5 is a table diagram schematically illustrating the difference between the voltage spread between the I/O power supply voltage VDDIO and the high level reference voltage VSSH and the voltage spread between the core power supply voltage VDDC and the reference VSS, in accordance with some embodiments.

DETAILED DESCRIPTION

Figure 1:
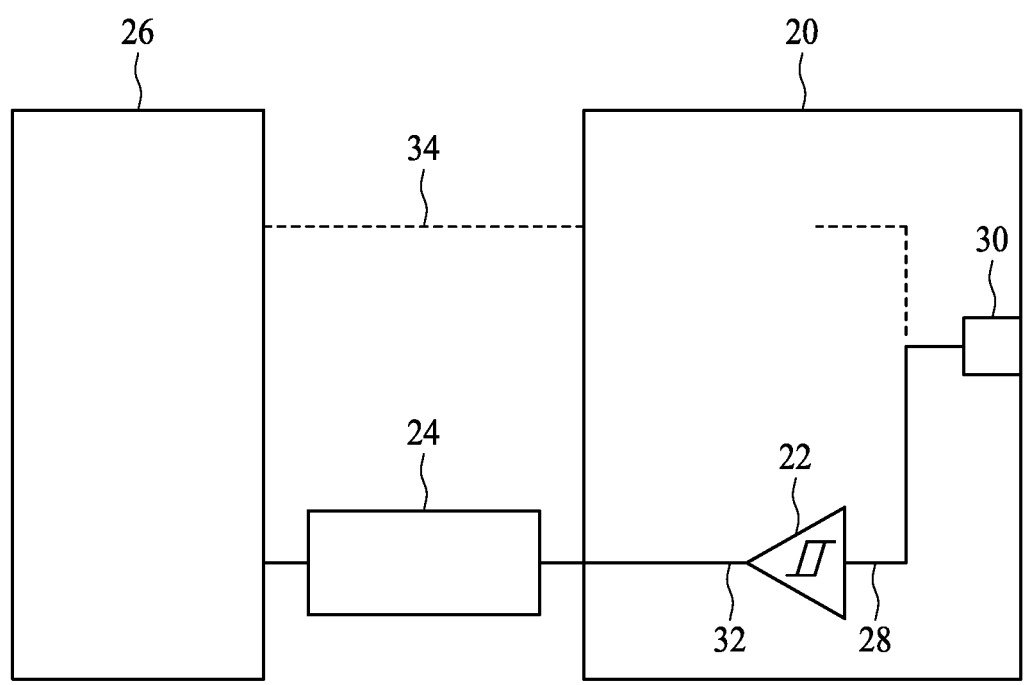
FIG. 1 is a diagram schematically illustrating an I/O interface that includes a Schmitt trigger coupled to a level converter and core logic devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments provide a Schmitt trigger circuit configured to be used in a mixed voltage I/O interface that receives an I/O power supply voltage VDDIO and a device core power supply voltage VDDC. The Schmitt trigger is configured to fulfill the demands of the I/O circuits in GAAFET devices and MBCFET devices. In some embodiments, the Schmitt trigger is configured to fulfill the demands of the I/O circuits in next generation technologies.

In some embodiments, the Schmitt trigger is designed and manufactured using only thin oxide FET devices. These thin oxide FET devices are configured to be used in faster digital circuits, such as standard cell logic circuits and standard cell logic blocks, and to operate on lower voltages, such as the core device power supply voltage VDDC. In other embodiments, the Schmitt trigger is designed and manufactured using thin oxide FET devices and thick oxide devices, where the thick oxide devices are configured to operate on higher voltages, such as the I/O power supply voltage VDDIO, without being damaged and to be used in I/O circuit transmit and receive applications. In still other embodiments, the Schmitt trigger is designed and manufactured using only thick oxide FET devices.

In some embodiments, the Schmitt trigger device includes an inverter circuit having an output and including at least two series connected PMOS transistors connected, at the output, in series to at least two series connected NMOS transistors, and a hysteresis control circuit coupled to the output to provide feedback to the at least two series connected PMOS transistors and to the at least two series connected NMOS transistors. The Schmitt trigger further includes a high-side input level shifter configured to shift the low level of the input signal, such as ground, to a higher voltage level and provide this higher voltage level to a gate of one PMOS transistor of the at least two PMOS transistors. Where the one PMOS transistor receives the higher voltage I/O power supply voltage VDDIO at a drain/source region of the PMOS transistor. This limits the voltage across the gate to drain/source region of the PMOS transistor, such that if the PMOS transistor is a thin oxide PMOS transistor it will not be damaged. In some embodiments, the Schmitt trigger further includes a low-side input level shifter configured to shift the high level of the input signal, such as 1.2 V, to a lower voltage level and provide the lower voltage level to a gate of one NMOS transistor of the at least two NMOS transistors. Where the one NMOS transistor is connected to a reference voltage, such as ground, at a drain/source region of the NMOS transistor. This limits the voltage across the gate to drain/source region of the NMOS transistor, such that if the NMOS transistor is a thin oxide NMOS transistor it will not be damaged.

In some embodiments, the Schmitt trigger includes a hysteresis control circuit that includes a first hysteresis control circuit having a PMOS hysteresis feedback transistor that has one drain/source region connected to a connection between the at least two series connected PMOS transistors of the inverter, and a high-side output level shifter connected to the output and to a gate of the PMOS hysteresis feedback transistor. The high-side output level shifter is configured to shift the low level of the output signal, such as ground, to a higher voltage level and provide this higher voltage level to the gate of the PMOS hysteresis feedback transistor. This limits the voltage across the gate to drain/source region of the PMOS hysteresis feedback transistor, such that if the PMOS hysteresis feedback transistor is a thin oxide PMOS transistor it will not be damaged.

In some embodiments, the Schmitt trigger includes a second hysteresis control circuit having an NMOS hysteresis feedback transistor that has one drain/source region connected to a connection between the at least two series connected NMOS transistors of the inverter, and a low-side output level shifter connected to the output and to a gate of the NMOS hysteresis feedback transistor. The low-side output level shifter is configured to shift the high level of the output signal, such as 1.2 V, to a lower voltage level and provide the lower voltage level to the gate of the NMOS hysteresis feedback transistor. This limits the voltage across the gate to drain/source region of the NMOS hysteresis feedback transistor, such that if the NMOS hysteresis feedback transistor is a thin oxide NMOS transistor it will not be damaged.

Disclosed embodiments include a method of manufacturing an integrated circuit that includes forming a PMOS field-effect transistor core with a first N-tap guard ring around the PMOS field-effect transistor core and a first P-tap guard ring around the first N-tap guard ring, and forming an NMOS field effect transistor core that is aligned in parallel with the PMOS field-effect transistor core and with a second P-tap guard ring around the NMOS field-effect transistor core and a second N-tap guard ring around the second P-tap guard ring.

In some embodiments, the method further includes forming at least two PMOS transistors of an inverter circuit in the PMOS field-effect transistor core and forming at least two NMOS transistors of the inverter circuit in the NMOS field-effect core, where the at least two PMOS transistors are centerline aligned with the at least two NMOS transistors. In some embodiments, the method further includes forming a high-side level shifter having two PMOS transistors in the PMOS field-effect transistor core and forming a low-side level shifter having two NMOS transistors in the NMOS field-effect transistor core, wherein the two PMOS transistors are centerline aligned with the two NMOS transistors.

Advantages of the disclosed embodiments include using only thin oxide FET devices in a circuit that includes a Schmitt trigger designed and manufactured using only thin oxide FET devices. This eliminates the problem of integration of thick oxide devices and thin oxide devices on the same die and reduces costs by eliminating extra masks for thick oxide FET devices and by eliminating keep out zones between thick oxide FET devices and thin oxide FET devices. In addition, the Schmitt trigger designed and manufactured using only thin-oxide FET devices can be used in GAAFET and MBCFET technologies, and other next generation technologies. Also, using only thin oxide FET devices in a circuit is layout and manufacturing friendly, where it provides more uniform patterns and densities that results in better yields, less density gradient effect (DGE), and a lower mismatch between FETs.

FIG. 1 is a diagram schematically illustrating an I/O interface 20 that includes a Schmitt trigger 22 coupled to a level converter 24 and core logic devices 26, in accordance with some embodiments. The Schmitt trigger 22 includes an input 28 electrically connected to an I/O pad 30 and an output 32 electrically connected to the level converter 24 that is electrically connected to the core logic devices 26. In some embodiments, the I/O interface 20 is a transceiver coupled at 34 to the logic core devices 26 and configured for bi-directional communications between the core logic devices 26 and one or more off-chip devices, such that the I/O pad 30 provides signals to and receives signals from the one or more off-chip devices.

In some embodiments, the Schmitt trigger 22 is designed and manufactured from only thin oxide FET devices. In other embodiments, the Schmitt trigger 22 is designed and manufactured from both thin oxide FET devices and thick oxide FET devices or from only thick oxide FET devices.

The I/O pad 30 receives input signals from the one or more off-chip devices and provides the input signals to the input 28 of the Schmitt trigger 22. The input 28 receives the input signals from the I/O pad 30 and the output 28 of the Schmitt trigger 22 provides output signals that correspond to the input signals to the level converter 24. The level converter 24 converts the voltage levels of the output signals to core domain input signals that are provided to the core logic devices 26. In some embodiments, the input signals at the I/O pad 30 ranges in voltage from 0-1.2 V and, in some embodiments, the output signals from the Schmitt trigger range in voltage from 0-1.2 V.

The I/O interface 20 is a mixed voltage I/O interface that receives the I/O power supply voltage VDDIO and the device core power supply voltage VDDC. In some embodiments, the I/O power supply voltage VDDIO is equal to or greater than 1.2 V, such as 1.2 V, 1.5 V, 1.8 V, and 2.5 V. In some embodiments, the device core power supply voltage VDDC is 0.75 V.

Figure 2:
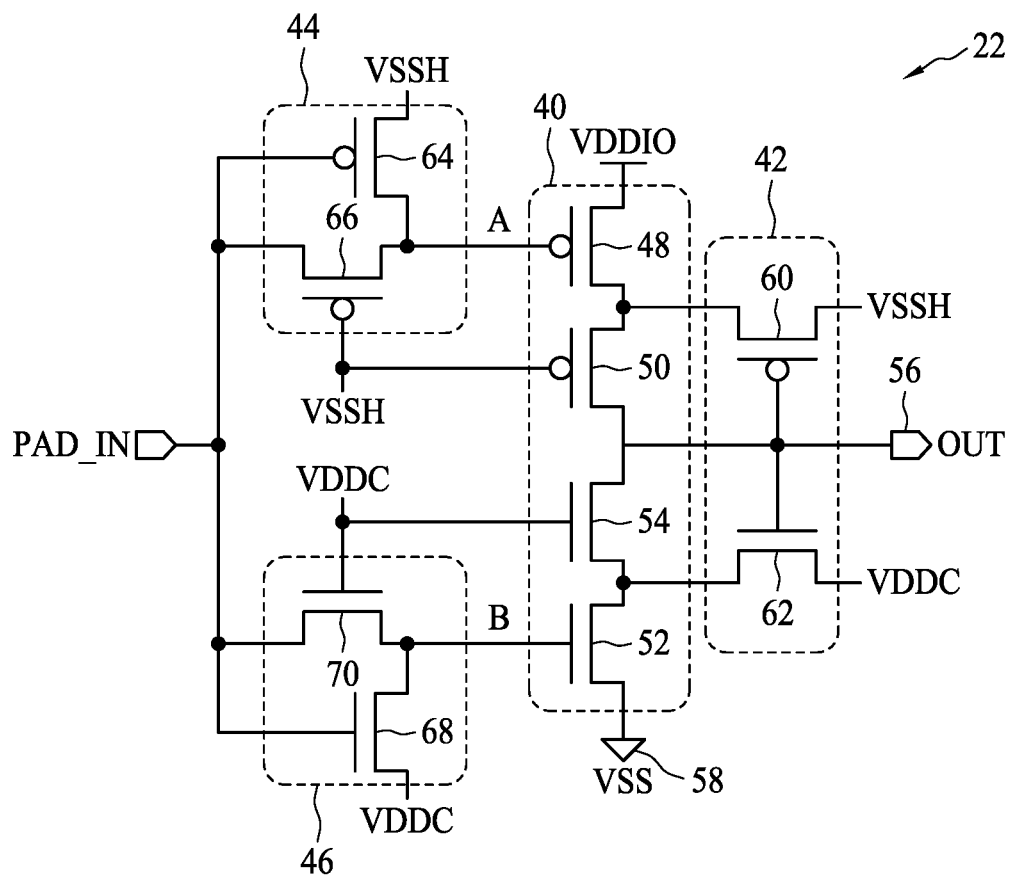
FIG. 2 is a diagram schematically illustrating the Schmitt trigger, in accordance with some embodiments.

FIG. 2 is a diagram schematically illustrating the Schmitt trigger 22, in accordance with some embodiments. The Schmitt trigger 22 is designed and manufactured from only thin oxide FET devices. In other embodiments, the Schmitt trigger 22 is designed and manufactured from both thin oxide FET devices and thick oxide FET devices or from only thick oxide FET devices.

The Schmitt trigger 22 includes an inverter circuit 40, a hysteresis control circuit 42, a high-side input level shifter 44, and a low-side input level shifter 46. The inverter circuit 40 includes a first PMOS transistor 48, a second PMOS transistor 50, a first NMOS transistor 52, and a second NMOS transistor 54. The first and second PMOS transistors 48 and 50 are electrically connected in series with each other, where one drain/source region of the first PMOS transistor 48 is electrically connected to receive the I/O power supply voltage VDDIO and the other drain/source region of the first PMOS transistor 48 is electrically connected to one drain/source region of the second PMOS transistor 50. The other drain/source region of the second PMOS transistor 50 is electrically connected to an output 56. Also, the first and second NMOS transistors 52 and 54 are electrically connected in series with each other, where one drain/source region of the first NMOS transistor 52 is electrically connected to a reference 58, such as ground, and the other drain/source region of the first NMOS transistor 52 is electrically connected to one drain/source region of the second NMOS transistor 54. The other drain/source region of the second NMOS transistor 54 is electrically connected to the output 56 and to the other drain/source region of the second PMOS transistor 50. In some embodiments, the I/O power supply voltage VDDIO is equal to or greater than 1.2 V, such as 1.2 V, 1.5 V, 1.8 V, and 2.5 V.

The hysteresis control circuit 42 includes a PMOS hysteresis feedback transistor 60 coupled to the output 56 and an NMOS hysteresis feedback transistor 62 coupled to the output 56. The PMOS hysteresis feedback transistor 60 and the NMOS hysteresis feedback transistor 62 are coupled to the output 56 to provide feedback to the at least two series connected PMOS transistors 48 and 50 and to the at least two series connected NMOS transistors 52 and 54.

The PMOS hysteresis feedback transistor 60 includes a gate electrically connected to the output 56 and one drain/source region electrically connected to the drain/source region of the first PMOS transistor 48 and the drain/source region of the second PMOS transistor 50, which are electrically connected to each other. The other drain/source region of the PMOS hysteresis feedback transistor 60 receives a high level reference voltage VSSH that is greater than the voltage of the reference 58. In some embodiments, the high level reference voltage VSSH is 0.45 V.

The NMOS hysteresis feedback transistor 62 includes a gate electrically connected to the output 56 and one drain/source region electrically connected to the drain/source region of the first NMOS transistor 52 and the drain/source region of the second NMOS transistor 54, which are electrically connected to each other. The other drain/source region of the NMOS hysteresis feedback transistor 62 receives the device core power supply voltage VDDC. In some embodiments, the device core power supply voltage VDDC is 0.75 V.

The high-side input level shifter 44 includes a first PMOS level shifter transistor 64 and a second PMOS level shifter transistor 66. The first PMOS level shifter transistor 64 has one drain/source region electrically connected to receive the high level reference voltage VSSH and another drain/source region electrically connected to a gate of the first PMOS transistor 48 and to one drain/source region of the second PMOS level shifter transistor 66. The one drain/source region of the second PMOS level shifter transistor 66 is also electrically connected to the gate of the first PMOS transistor 48. Another drain/source region of the second PMOS level shifter transistor 66 is electrically connected to a gate of the first PMOS level shifter transistor 64 and to receive the input signal PAD_IN. Also, the gate of the second PMOS level shifter transistor 66 is electrically connected to the gate of the second PMOS transistor 50 and to receive the high level reference voltage VSSH. The high-side input level shifter 44 includes the first PMOS level shifter transistor 64 and the second PMOS level shifter transistor 66 electrically connected to the gates of the first and second PMOS transistors 48 and 50 to shift a lower level of the input signal PAD_IN to a higher level, such as the high level reference voltage VSSH, and provide this higher level to the gate of the first PMOS transistor 48.

The low-side input level shifter 46 includes a first NMOS level shifter transistor 68 and a second NMOS level shifter transistor 70. The first NMOS level shifter transistor 68 has one drain/source region electrically connected to receive the device core power supply voltage VDDC and another drain/source region electrically connected to a gate of the first NMOS transistor 52 and to one drain/source region of the second NMOS level shifter transistor 70. The one drain/source region of the second NMOS level shifter transistor 70 is also electrically connected to the gate of the first NMOS transistor 52. Another drain/source region of the second NMOS level shifter transistor 70 is electrically connected to a gate of the first NMOS level shifter transistor 68 and to receive the input signal PAD_IN. Also, the gate of the second NMOS level shifter transistor 70 is electrically connected to the gate of the second NMOS transistor 54 and to receive the device core power supply voltage VDDC. The low-side input level shifter 46 includes the first NMOS level shifter transistor 68 and the second NMOS level shifter transistor 70 electrically connected to the gates of the first and second NMOS transistors 52 and 54 to shift a higher level of the input signal PAD_IN to a lower level, such as the device core power supply voltage VDDC, and provide the lower level to the gate of the first NMOS transistor 52.

In operation of the Schmitt trigger 22, if the input signal PAD_IN is at a low voltage level, such as 0 V, the first PMOS level shifter transistor 64 is biased on to conduct and the high level reference voltage VSSH, such as 0.45 V, is provided to the gate of the first PMOS transistor 48. Also, the high level reference voltage VSSH is provided to the gates of the second PMOS level shifter transistor 66 and the second PMOS transistor 50, such that the second PMOS level shifter transistor 66 is biased off and the second PMOS transistor 50 is biased on. With the first and second PMOS transistors 48 and 50 biased on, the I/O power supply voltage VDDIO, such as 1.2 V, is provided to the output 56 through the first and second PMOS transistors 48 and 50.

With the voltage levels at the gates of the first and second PMOS transistors 48 and 50 at the high level reference voltage VSSH, neither of the first and second PMOS transistors 48 and 50 is damaged by the drain/source to gate voltage levels, even if the first and second PMOS transistors 48 and 50 are thin oxide FET devices. Also, with the voltage level at the drain/source of the first PMOS level shifter transistor 64 and at the gate of the second PMOS level shifter transistor 66 at the high level reference voltage VSSH, the first and second PMOS level shifter transistors 64 and 66 are not damaged by the drain/source to gate voltage levels, even if the first and second PMOS level shifter transistors 64 and 66 are thin oxide FET devices.

As to the first NMOS level shifter transistor 68 and the second NMOS level shifter transistor 70, with the input signal PAD_IN at the low voltage level, such as 0 V, the first NMOS level shifter transistor 68 is biased off and the second NMOS level shifter transistor 70 is biased on to provide the low voltage level at the input signal PAD_IN to the gate of the first NMOS transistor 52. This biases off the first NMOS transistor 52. Also, with the output 56 at or near the I/O power supply voltage VDDIO, such as 1.2 V, and the gate of the second NMOS transistor 54 at the core power supply voltage VDDC, such as 0.75 V, the second NMOS transistor 54 is biased off. With the voltage level at the drain/source of the first NMOS level shifter transistor 68 and at the gate of the second NMOS level shifter transistor 70 at the device core power supply voltage VDDC, the first and second NMOS level shifter transistors 68 and 70 are not damaged by the drain/source to gate voltage levels, even if the first and second NMOS level shifter transistors 68 and 70 are thin oxide FET devices.

The high voltage at the output 56 biases the PMOS hysteresis feedback transistor 60 off and the NMOS hysteresis feedback transistor 62 on to provide the device core power supply voltage VDDC to the connection between the first and second NMOS transistors 52 and 54. With the voltage level at the gate of the second NMOS transistor 54 at the device core power supply voltage VDDC and the output 56 at the I/O power supply voltage VDDIO, the second NMOS transistor 54 is not damaged by the drain/source to gate voltage level, even if the second NMOS transistor 54 is a thin oxide FET device. Also, with the drain/source voltage of the first NMOS transistor 52 at the device core power supply voltage VDDC and the gate at the low level input voltage, the first NMOS transistor 52 is not damaged by the drain/source to gate voltage level, even if the first NMOS transistor 52 is a thin oxide FET device.

When the input signal PAD_IN switches from a low voltage, such as 0 V, to a high voltage, such as 1.2 V, the first PMOS level shifter transistor 64 is biased off and the second PMOS level shifter transistor 66 is biased on to provide the high voltage of the input signal PAD_IN to the gate of the first PMOS transistor 48, which biases off the first PMOS transistor 48. Also, the output 56 switches to a low voltage level and the second PMOS transistor 50 is biased off. With the voltage level at the drain/source of the first PMOS level shifter transistor 64 and at the gate of the second PMOS level shifter transistor 66 at the high level reference voltage VSSH, the first and second PMOS level shifter transistors 64 and 66 are not damaged by the drain/source to gate voltage levels, even if the first and second PMOS level shifter transistors 64 and 66 are thin oxide FET devices.

Also, with the input signal PAD_IN at the high voltage level, the second NMOS level shifter transistor 70 is biased off and the first NMOS level shifter transistor 68 is biased on to provide the device core power supply voltage VDDC to the gate of the first NMOS transistor 52. The first NMOS transistor 52 is biased on and the second NMOS transistor 54 is biased on, but only after the input signal PAD_IN has risen to a high enough voltage level and the connection between the first and second NMOS transistors 52 and 54 has dropped to a low enough voltage level to bias on the second NMOS transistor 54, and provide a low voltage level that is near the reference 58 to the output 56. Having the core power supply voltage VDDC at the connection between the first and second NMOS transistors 52 and 54, results in a higher input voltage level at the input signal PAD_IN for switching the output 56 from the high voltage level that is near the I/O power supply voltage VDDIO, such as 1.2 V, to the low voltage level that is near the reference 58, such as 0 V.

With the voltage levels at the gates of the first and second NMOS transistors 52 and 54 at the core power supply voltage VDDC, neither of the first and second NMOS transistors 52 and 54 is damaged by the drain/source to gate voltage levels, even if the first and second NMOS transistors 52 and 54 are thin oxide FET devices. Also, with the voltage level at the drain/source of the first NMOS level shifter transistor 68 and at the gate of the second NMOS level shifter transistor 70 at the core power supply voltage VDDC, the first and second NMOS level shifter transistors 68 and 70 are not damaged by the drain/source to gate voltage levels, even if the first and second NMOS level shifter transistors 68 and 70 are thin oxide FET devices.

The low voltage level at the output 56, biases off the NMOS hysteresis feedback transistor 62 and biases on the PMOS hysteresis feedback transistor 60 to provide the high level reference voltage VSSH to the connection between the first and second PMOS transistors 48 and 50. Since, the voltage level at the gate of the second PMOS transistor 50 is at the high level reference voltage VSSH and the output 56 is at or near the reference 58, the second PMOS transistor is not damaged by the drain/source to gate voltage level, even if the second PMOS transistor is a thin oxide FET device. Also, since the drain/source voltage of the first PMOS transistor 48 is at the I/O power supply voltage VDDIO and the gate is at the high voltage input signal PAD_IN, the first PMOS transistor 48 is not damaged by the drain/source to gate voltage level, even if the first PMOS transistor is a thin oxide FET device.

When the input signal PAD_IN switches from the high voltage level to the low voltage level, the first NMOS level shifter transistor 68 is biased off and the second NMOS level shifter transistor 70 is biased on to provide the low voltage of the input signal PAD_IN to the gate of the first NMOS transistor 52, which biases off the first NMOS transistor 52. Also, with the output 56 at the high voltage level, the second NMOS transistor 54 is biased off. In addition, the second PMOS level shifter transistor 66 is biased off and the first PMOS level shifter transistor 64 is biased on to provide the high level reference voltage VSSH to the gate of the first PMOS transistor 48. The first PMOS transistor 48 is biased on and the second PMOS transistor 50 is biased on, but only after the input signal PAD_IN has dropped to a low enough voltage level and the connection between the first and second PMOS transistors 48 and 50 has risen to a high enough voltage level to bias on the second PMOS transistor 50, which provides a high voltage level near the I/O power supply voltage VDDIO to the output 56. Having the high level reference voltage VSSH at the connection between the first and second PMOS transistors 48 and 50, results in a lower input voltage level at the input signal PAD_IN for switching the output 56 from the low voltage level near the reference 58, such as 0 V, to the high voltage level near the I/O power supply voltage VDDIO, such as 1.2 V.

The PMOS hysteresis feedback transistor 60 is biased off by the high voltage at the output 56 and the NMOS hysteresis feedback transistor 62 is biased on by the high voltage at the output 56 to provide the core power supply voltage VDDC to the connection between the first and second NMOS transistors 52 and 54.

In the Schmitt trigger 22, the gate of the second PMOS transistor 50 is biased to the high level reference voltage VSSH, such that the second PMOS transistor 50 acts as a cascode transistor that protects the first PMOS transistor 48 from being overstressed. Also, the gate of the second NMOS transistor 54 is biased to the core power supply voltage VDDC, such that the second NMOS transistor 54 acts as a cascode transistor that protects the first NMOS transistor 52 from being overstressed. In addition, when switching the input signal PAD_IN from a low voltage level to a high voltage level, having the core power supply voltage VDDC at the connection between the first and second NMOS transistors 52 and 54 results in a higher input voltage level for switching the output 56 from the high voltage level that is near the I/O power supply voltage VDDIO to the low voltage level that is near the reference 58, and when switching the input signal PAD_IN from a high voltage level to a low voltage level, having the high level reference voltage VSSH at the connection between the first and second PMOS transistors 48 and 50, results in a lower input voltage level for switching the output 56 from the low voltage level that is near the reference 58 to the high voltage level that is near the I/O power supply voltage VDDIO. This results in different transition input threshold voltages ViH and ViL in the input signal PAD_IN, which provides a hysteresis window and better noise immunity than a simple inverter.

Figure 3:
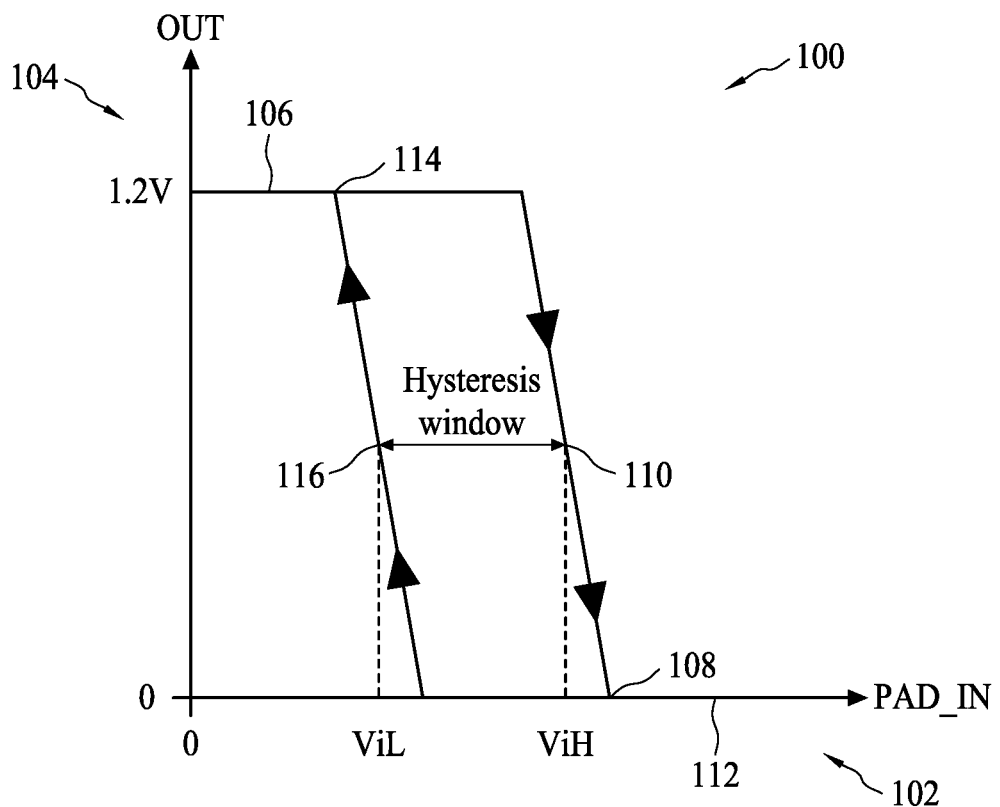
FIG. 3 is a graph diagram schematically illustrating an input-output transfer curve of the Schmitt trigger, in accordance with some embodiments.

FIG. 3 is a graph diagram schematically illustrating an input-output transfer curve 100 of the Schmitt trigger 22, in accordance with some embodiments. The input-output transfer curve 100 is graphed with the input signal PAD_IN along the x-axis at 102 and the output signal OUT at the output 56 along the y-axis 104. As indicated, at 106, with the input signal PAD_IN at a low voltage, such as 0 V, the output signal OUT is at a high voltage, such as 1.2 V.

As the input signal PAD_IN is increased from the low voltage at 106 to a higher voltage at 108, the first PMOS level shifter transistor 64 is biased off and the second PMOS level shifter transistor 66 is biased on to provide the higher voltage of the input signal PAD_IN to the gate of the first PMOS transistor 48, which biases off the first PMOS transistor 48 and the second PMOS transistor 50. Also, the second NMOS level shifter transistor 70 is biased off and the first NMOS level shifter transistor 68 is biased on to provide the device core power supply voltage VDDC to the gate of the first NMOS transistor 52, which biases on the first NMOS transistor 52 and the second NMOS transistor 54, but only after the input signal PAD_IN has risen to a high enough voltage and the connection between the first and second NMOS transistors 52 and 54 has dropped to a low enough voltage to bias on the second NMOS transistor 54 and provide the low voltage level in the output signal OUT at the output 56. The input voltage ViH for this high-to-low transition at the output 56 is measured from the mid-point of the falling input-output curve at 110 along the x-axis at 102. Having the core power supply voltage VDDC at the connection between the first and second NMOS transistors 52 and 54, results in a higher input voltage ViH for switching the output 56 from the high voltage level that is near the I/O power supply voltage VDDIO, such as 1.2 V, to the low voltage level that is near the reference 58, such as 0 V.

As indicated, at 112, with the input signal PAD_IN at a high voltage, such as 1.2 V, the output signal OUT is at a low voltage, such as 0 V. As the voltage of the input signal PAD_IN is decreased from the high voltage at 112 to a lower voltage at 114, the first NMOS level shifter transistor 68 is biased off and the second NMOS level shifter transistor 70 is biased on to provide the lower voltage of the input signal PAD_IN to the gate of the first NMOS transistor 52, which biases off the first NMOS transistor 52 and the second NMOS transistor 54. Also, the second PMOS level shifter transistor 66 is biased off and the first PMOS level shifter transistor 64 is biased on to provide the high level reference voltage VSSH to the gate of the first PMOS transistor 48, which biases on the first PMOS transistor 48 and the second PMOS transistor 50, but only after the input signal PAD_IN has dropped to a low enough voltage and the connection between the first and second PMOS transistors 48 and 50 has risen to a high enough voltage to bias on the second PMOS transistor 50 and provide the high voltage level that is near the I/O power supply voltage VDDIO to the output 56. The input voltage ViL for this low-to-high transition at the output 56 is measured from the mid-point of the rising input-output curve at 116 along the x-axis at 102. Having the high level reference voltage VSSH at the connection between the first and second PMOS transistors 48 and 50, results in a lower input voltage level at the input signal PAD_IN for switching the output 56 from the low voltage level that is near the reference 58, such as 0 V, to the high voltage level that is near the I/O power supply voltage VDDIO, such as 1.2 V.

The input-output transfer curve 100 has different high-to-low and low-to-high transition input threshold voltages ViH and ViL, respectively. The difference between the input threshold voltages ViH and ViL is the hysteresis window of the Schmitt trigger 22, where the size of the hysteresis window is controlled by the first and second hysteresis control transistors 60 and 62.

Figure 4:
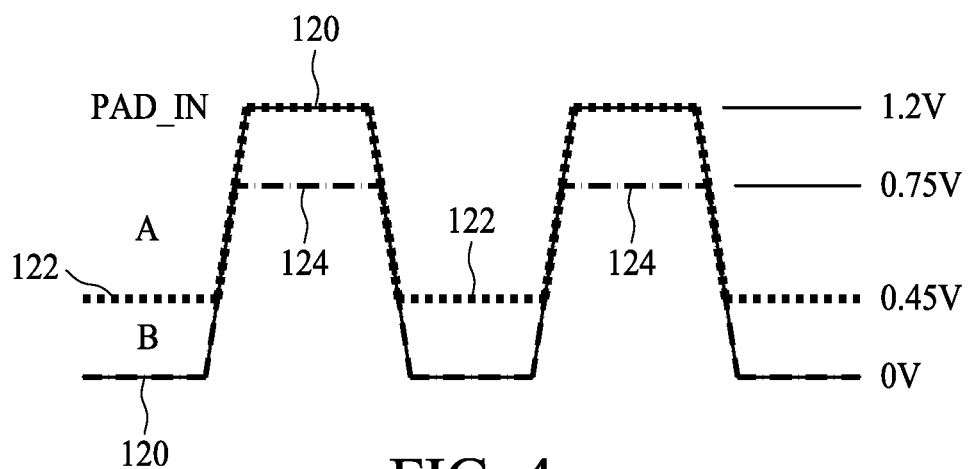
FIG. 4 is a graph diagram illustrating level shifting of the input signal from I/O voltage levels to core voltage levels at nodes A and B in FIG. 2, in accordance with some embodiments.

FIG. 4 is a graph diagram illustrating level shifting of the input signal PAD_IN 120 from I/O voltage levels of 0 V to 1.2 V to core voltage levels in signal 122 at node A in FIG. 2 and in signal 124 at node B in FIG. 2, in accordance with some embodiments. The signal 122 at node A does not overstress the first PMOS transistor 48, when the first PMOS transistor 48 is a thin oxide FET device, and the signal 124 at node B does not overstress the first NMOS transistor 52, when the first NMOS transistor 52 is a thin oxide FET device.

In some embodiments, the high-side input level shifter 44 transforms the input signal PAD_IN from I/O voltages of 0 V to 1.2 V to voltages of 0.45 V to 1.2 V at node A. In some embodiments, the low-side input level shifter 46 transforms the input signal PAD_IN from I/O voltages of 0 V to 1.2 V to voltages of 0 V to 0.75 V at node B. Thus, the drain/source to gate voltages of the first PMOS transistor 48 and the first NMOS transistor 52 do not exceed 0.75 V. This prevents drain/source to gate voltages from overstressing the first PMOS transistor 48 and the first NMOS transistor 52, when they are thin oxide FET devices, and delivers the correct signals with core voltage leveling to the thin oxide FET devices.

In the high-side input level shifter 44, if the input signal PAD_IN is at a low voltage level, such as 0 V, the first PMOS level shifter transistor 64 is biased on to conduct and the high level reference voltage VSSH, such as 0.45 V, is provided at node A to the gate of the first PMOS transistor 48. Also, the high level reference voltage VSSH is provided to the gates of the second PMOS level shifter transistor 66 and the second PMOS transistor 50, such that the second PMOS level shifter transistor 66 is biased off and the second PMOS transistor 50 is biased on. With the first and second PMOS transistors 48 and 50 biased on, the I/O power supply voltage VDDIO, such as 1.2 V, is provided to the output 56. Also, if the input signal PAD_IN is a high voltage, such as 1.2 V, the first PMOS level shifter transistor 64 is biased off and the second PMOS level shifter transistor 66 is biased on to provide the high voltage to the gate of the first PMOS transistor 48, which biases off the first PMOS transistor 48 and (with the output 56 at a low voltage level) the second PMOS transistor 50.

Thus, the high-side input level shifter 44 transforms the input signal PAD_IN from I/O voltages of 0 to 1.2 V to core voltages of 0.45 to 1.2 V at node A for operating the first PMOS transistor 48, even when it is a thin oxide PMOS FET, without overstressing it.

In the low-side input level shifter 46, if the input signal PAD_IN is at the low voltage level, such as 0 V, the first NMOS level shifter transistor 68 is biased off and the second NMOS level shifter transistor 70 is biased on to provide the low voltage level to the gate of the first NMOS transistor 52. This biases off the first NMOS transistor 52 and (with the output 56 at the I/O power supply voltage VDDIO) the second NMOS transistor 54. Also, if the input signal PAD_IN is at the high voltage level, such as 1.2 V, the second NMOS level shifter transistor 70 is biased off and the first NMOS level shifter transistor 68 is biased on to provide the device core power supply voltage VDDC, such as 0.75 V, to the gate of the first NMOS transistor 52. The first NMOS transistor 52 is biased on and the second NMOS transistor 54 is biased on to provide a low voltage level that is near the reference 58 to the output 56.

Thus, the low-side input level shifter 46 transforms the input signal PAD_IN from I/O voltages of 0 to 1.2 V to core voltages of 0 V to 0.75 V at node B for operating the first NMOS transistor 52, even when it is a thin oxide NMOS FET, without overstressing it.

Referring to FIG. 3, the Schmitt trigger 22 provides the input-output transfer curve 100 that includes hysteresis. The difference between the input threshold voltages ViH and ViL defines the size of the hysteresis window of the Schmitt trigger 22, which is controlled by the PMOS hysteresis control transistor 60 and the NMOS hysteresis control transistor 62. Also, the size of the hysteresis window varies based on the voltages provided to the Schmitt trigger 22. The I/O power supply voltage VDDIO and the high level reference voltage VSSH are provided to the PMOS transistors 48, 50, 60, 64, and 66, referred to as the hi-side of the Schmitt trigger 42, and the device core power supply voltage VDDC and reference VSS 58 are provided to the NMOS transistors 52, 54, 62, 68, and 70, referred to as the lo-side of the Schmitt trigger 22. The size of the hysteresis window of the Schmitt trigger 22 varies based on the difference between: 1) the voltage spread between the I/O power supply voltage VDDIO and the high level reference voltage VSSH; and 2) the voltage spread between the core power supply voltage VDDC and the reference VSS 58.

FIG. 5 is a table diagram schematically illustrating the difference between the voltage spread between the I/O power supply voltage VDDIO and the high level reference voltage VS SH and the voltage spread between the core power supply voltage VDDC and the reference VSS 58, in accordance with some embodiments.

In some embodiments, on the hi-side, the I/O power supply voltage VDDIO at 140 has a typical voltage value of 1.05 V that may vary up to 20% or a maximum voltage value of 1.26 V, and the high level reference voltage VSSH at 142 has a typical voltage value of 0.45 V that may vary up to 10% or a maximum voltage value of 0.495 V. This results in a delta at 144 between the I/O power supply voltage VDDIO and the high level reference voltage VS SH that has a typical voltage value of 0.6 V and a maximum voltage value of 0.765 V, which is an increase of 1.28 times the typical voltage value of 0.6 V.

In some embodiments, on the lo-side, the core power supply voltage VDDC at 146 has a typical voltage value of 0.75 V that may vary up to 10% or a maximum voltage value of 0.825 V, and the reference VSS at 148 has a typical voltage value of 0 V and a maximum voltage value of 0 V. This results in a delta at 150 between the core power supply voltage VDDC and the reference VSS that has a typical voltage value of 0.75 V and a maximum voltage value of 0.825 V, which is an increase of 1.1 times the typical voltage value of 0.75 V.

Thus, the voltage spread in the hi-side voltages is 1.28 times the typical voltage value and the voltage spread in the lo-side voltages is 1.1 times the typical voltage value. The difference in these voltage spreads results in an imbalance between the feedback from the PMOS hysteresis control transistor 60 and the feedback from the NMOS hysteresis control transistor 62, leading to variations in the size of the hysteresis window of the Schmitt trigger 42.

The variations in the size of the hysteresis window result from the differences in the voltages across transistors in the Schmitt trigger 22. For example, the drain/gate to source voltage of the first PMOS transistor 48 and the drain/gate to source voltage of the first NMOS transistor 52. Where, the drain/gate to source voltage of the first PMOS transistor 48 is based on the I/O power supply voltage VDDIO to the high level reference voltage VSSH, which has a voltage spread of 1.28 times the typical voltage value, and the drain/gate to source voltage of the first NMOS transistor 52 is based on the core power supply voltage VDDC to the reference VSS, which has a voltage spread of 1.1 times the typical voltage value.

Also, for example, the drain to source voltage of the PMOS hysteresis feedback transistor 60 and the drain to source voltage of the NMOS hysteresis feedback transistor 62. Where, the drain to source voltage of the PMOS hysteresis feedback transistor 60 is based on the I/O power supply voltage VDDIO to the high level reference voltage VSSH, which has a voltage spread of 1.28 times the typical voltage value, and the drain to source voltage of the NMOS hysteresis feedback transistor 62 is based on the core power supply voltage VDDC to the reference VSS, which has a voltage spread of 1.1 times the typical voltage value.

Figure 6:
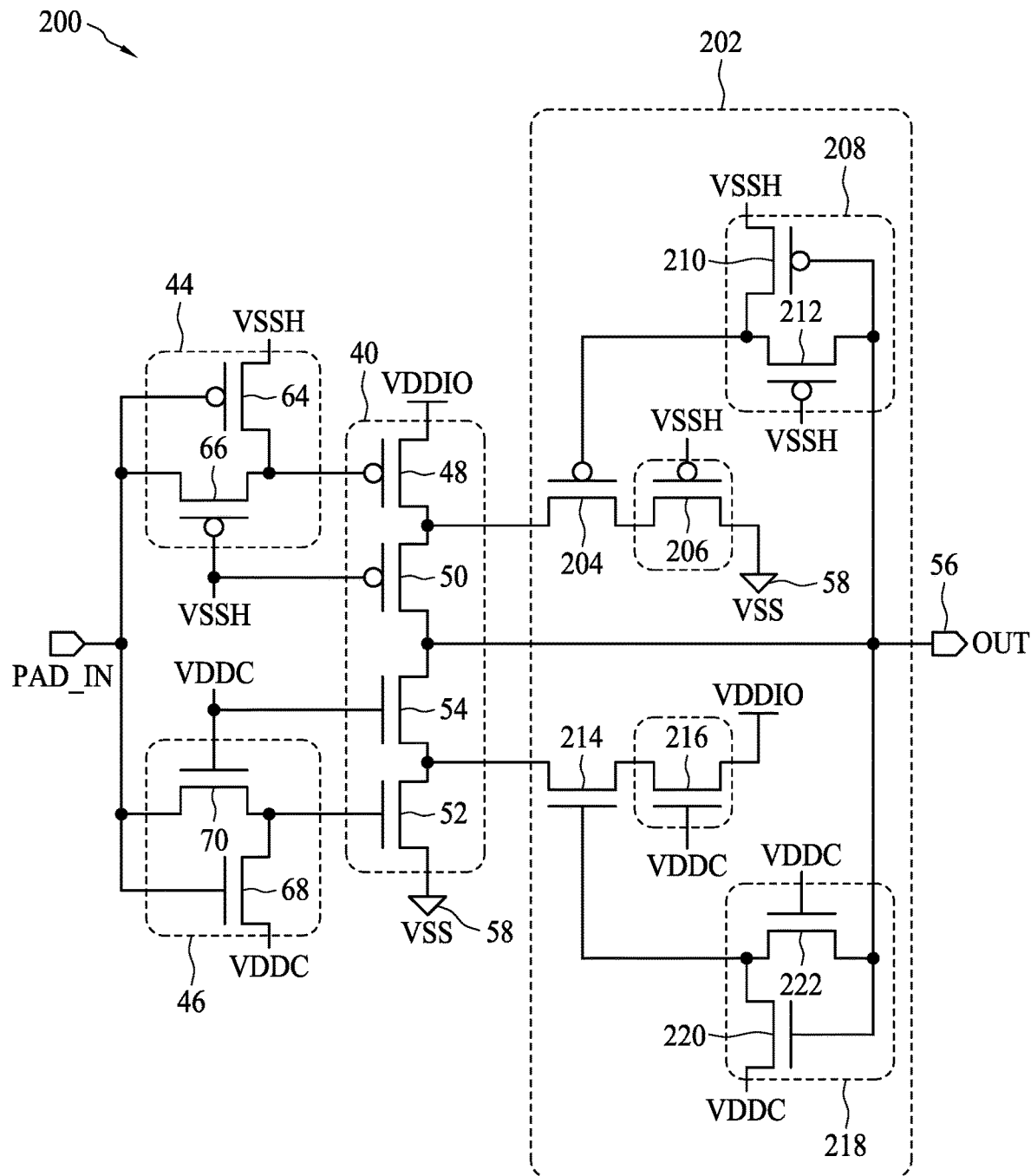
FIG. 6 is a diagram schematically illustrating a Schmitt trigger that includes a hysteresis control circuit that reduces variations in the size of the hysteresis window of the Schmitt trigger, in accordance with some embodiments.

FIG. 6 is a diagram schematically illustrating a Schmitt trigger 200 that includes a hysteresis control circuit 202 that reduces variations in the size of the hysteresis window of the Schmitt trigger 200, in accordance with some embodiments. The Schmitt trigger 200 is designed and manufactured from only thin oxide FET devices. In some embodiments, the Schmitt trigger 200 is used in the I/O interface 20 (shown in FIG. 1). In some embodiments, the Schmitt trigger 200 can be used in place of the Schmitt trigger 22 (shown in FIG. 1). In other embodiments, the Schmitt trigger 200 is designed and manufactured from both thin oxide FET devices and thick oxide FET devices or from only thick oxide FET devices.

The Schmitt trigger 200 includes the inverter circuit 40, the hysteresis control circuit 202, the high-side input level shifter 44, and the low-side input level shifter 46. The inverter circuit 40, the high-side input level shifter 44, and the low-side input level shifter 46 are like the inverter circuit 40, the high-side input level shifter 44, and the low-side input level shifter 46 in the Schmitt trigger 22.

The inverter circuit 40 includes the first PMOS transistor 48, the second PMOS transistor 50, the first NMOS transistor 52, and the second NMOS transistor 54. The first and second PMOS transistors 48 and 50 are electrically connected in series with each other, where one drain/source region of the first PMOS transistor 48 is electrically connected to receive the I/O power supply voltage VDDIO and the other drain/source region of the first PMOS transistor 48 is electrically connected to one drain/source region of the second PMOS transistor 50. The other drain/source region of the second PMOS transistor 50 is electrically connected to the output 56. Also, the first and second NMOS transistors 52 and 54 are electrically connected in series with each other, where one drain/source region of the first NMOS transistor 52 is electrically connected to the reference VSS 58, such as ground, and the other drain/source region of the first NMOS transistor 52 is electrically connected to one drain/source region of the second NMOS transistor 54. The other drain/source region of the second NMOS transistor 54 is electrically connected to the output 56 and to the other drain/source region of the second PMOS transistor 50. In some embodiments, the I/O power supply voltage VDDIO is equal to or greater than 1.2 V, such as 1.2 V, 1.5 V, 1.8 V, and 2.5 V.

The hysteresis control circuit 202 is different than the hysteresis control circuit 42 (shown in FIG. 2). The hysteresis control circuit 202 includes a PMOS hysteresis feedback transistor 204, a cascode PMOS transistor 206, a high-side output level shifter 208 that includes a first PMOS level shifter transistor 210 and a second PMOS level shifter transistor 212, an NMOS hysteresis feedback transistor 214, a cascode NMOS transistor 216, and a low-side output level shifter 218 that includes a first NMOS level shifter transistor 220 and a second NMOS level shifter transistor 222.

The PMOS hysteresis feedback transistor 204 is coupled to the output 56 and the NMOS hysteresis feedback transistor 206 is coupled to the output 56 to provide feedback to the at least two series connected PMOS transistors 48 and 50 and to the at least two series connected NMOS transistors 52 and 54, respectively.

The PMOS hysteresis feedback transistor 204 includes one drain/source region electrically connected to the drain/source region of the first PMOS transistor 48 and the drain/source region of the second PMOS transistor 50, which are electrically connected to each other. The other drain/source region of the PMOS hysteresis feedback transistor 204 is electrically connected to one drain/source region of the cascode PMOS transistor 206 and another drain/source region of the cascode PMOS transistor 206 is electrically connected to the reference VSS 58. The gate of the cascode PMOS transistor 206 is electrically connected to receive the high level reference voltage VSSH that is greater than the voltage of the reference VSS 58. In some embodiments, the high level reference voltage VSSH is 0.45 V.

In the high-side output level shifter 208, the first PMOS level shifter transistor 210 has one drain/source region electrically connected to receive the high level reference voltage VSSH and another drain/source region electrically connected to a gate of the PMOS hysteresis feedback transistor 204 and to one drain/source region of the second PMOS level shifter transistor 212. The one drain/source region of the second PMOS level shifter transistor 212 is also electrically connected to the gate of the PMOS hysteresis feedback transistor 204. Another drain/source region of the second PMOS level shifter transistor 212 is electrically connected to the gate of the first PMOS level shifter transistor 210 and to the output 56. Also, the gate of the second PMOS level shifter transistor 212 is electrically connected to receive the high level reference voltage VSSH. The high-side output level shifter 208 includes the first PMOS level shifter transistor 210 and the second PMOS level shifter transistor 212 electrically connected to the gate of the PMOS hysteresis feedback transistor 204 to shift a low level output signal at the output 56 to a higher level, such as the high level reference voltage VSSH, and provide this higher level to the gate of the PMOS hysteresis feedback transistor 204.

The NMOS hysteresis feedback transistor 214 includes one drain/source region electrically connected to the drain/source region of the first NMOS transistor 52 and the drain/source region of the second NMOS transistor 54, which are electrically connected to each other. The other drain/source region of the NMOS hysteresis feedback transistor 214 is electrically connected to one drain/source region of the cascode NMOS transistor 216 and another drain/source region of the cascode NMOS transistor 216 is electrically connected to the I/O power supply voltage VDDIO. The gate of the cascode NMOS transistor 216 is electrically connected to receive the core power supply voltage VDDC. In some embodiments, the device core power supply voltage VDDC is 0.75 V.

In the low-side output level shifter 218, the first NMOS level shifter transistor 220 has one drain/source region electrically connected to receive the device core power supply voltage VDDC and another drain/source region electrically connected to a gate of the NMOS hysteresis feedback transistor 214 and to one drain/source region of the second NMOS level shifter transistor 222. The one drain/source region of the second NMOS level shifter transistor 222 is also electrically connected to the gate of the NMOS hysteresis feedback transistor 214. Another drain/source region of the second NMOS level shifter transistor 222 is electrically connected to the gate of the first NMOS level shifter transistor 220 and to the output 56. Also, the gate of the second NMOS level shifter transistor 222 is electrically connected to receive the device core power supply voltage VDDC. The low-side output level shifter 218 includes the first NMOS level shifter transistor 220 and the second NMOS level shifter transistor 222 electrically connected to the gate of the NMOS hysteresis feedback transistor 214 to shift a high level output signal at the output 56 to a lower level, such as the device core power supply voltage VDDC, and provide this lower level to the gate of the NMOS hysteresis feedback transistor 214.

The high-side input level shifter 44 includes a first PMOS level shifter transistor 64 and a second PMOS level shifter transistor 66. The first PMOS level shifter transistor 64 has one drain/source region electrically connected to receive the high level reference voltage VSSH and another drain/source region electrically connected to a gate of the first PMOS transistor 48 and to one drain/source region of the second PMOS level shifter transistor 66. The one drain/source region of the second PMOS level shifter transistor 66 is also electrically connected to the gate of the first PMOS transistor 48. Another drain/source region of the second PMOS level shifter transistor 66 is electrically connected to a gate of the first PMOS level shifter transistor 64 and to receive the input signal PAD_IN. Also, the gate of the second PMOS level shifter transistor 66 is electrically connected to the gate of the second PMOS transistor 50 and to receive the high level reference voltage VSSH. The high-side input level shifter 44 includes the first PMOS level shifter transistor 64 and the second PMOS level shifter transistor 66 electrically connected to the gates of the first and second PMOS transistors 48 and 50 to shift a lower level of the input signal PAD_IN to a higher level, such as the high level reference voltage VSSH, and provide this higher level to the gate of the first PMOS transistor 48.

The low-side input level shifter 46 includes a first NMOS level shifter transistor 68 and a second NMOS level shifter transistor 70. The first NMOS level shifter transistor 68 has one drain/source region electrically connected to receive the device core power supply voltage VDDC and another drain/source region electrically connected to a gate of the first NMOS transistor 52 and to one drain/source region of the second NMOS level shifter transistor 70. The one drain/source region of the second NMOS level shifter transistor 70 is also electrically connected to the gate of the first NMOS transistor 52. Another drain/source region of the second NMOS level shifter transistor 70 is electrically connected to a gate of the first NMOS level shifter transistor 68 and to receive the input signal PAD_IN. Also, the gate of the second NMOS level shifter transistor 70 is electrically connected to the gate of the second NMOS transistor 54 and to receive the device core power supply voltage VDDC. The low-side input level shifter 46 includes the first NMOS level shifter transistor 68 and the second NMOS level shifter transistor 70 electrically connected to the gates of the first and second NMOS transistors 52 and 54 to shift a higher level of the input signal PAD_IN to a lower level, such as the device core power supply voltage VDDC, and provide the lower level to the gate of the first NMOS transistor 52.

In operation of the Schmitt trigger 200, if the input signal PAD_IN is at a low voltage level, such as 0 V, the first PMOS level shifter transistor 64 is biased on to conduct and the high level reference voltage VSSH, such as 0.45 V, is provided to the gate of the first PMOS transistor 48. Also, the high level reference voltage VSSH is provided to the gates of the second PMOS level shifter transistor 66 and the second PMOS transistor 50, such that the second PMOS level shifter transistor 66 is biased off and the second PMOS transistor 50 is biased on. With the first and second PMOS transistors 48 and 50 biased on, the I/O power supply voltage VDDIO, such as 1.2 V, is provided to the output 56 through the first and second PMOS transistors 48 and 50.

With the voltage levels at the gates of the first and second PMOS transistors 48 and 50 at the high level reference voltage VSSH, neither of the first and second PMOS transistors 48 and 50 is damaged by the drain/source to gate voltage levels, even if the first and second PMOS transistors 48 and 50 are thin oxide FET devices. Also, with the voltage level at the drain/source of the first PMOS level shifter transistor 64 and at the gate of the second PMOS level shifter transistor 66 at the high level reference voltage VSSH, the first and second PMOS level shifter transistors 64 and 66 are not damaged by the drain/source to gate voltage levels, even if the first and second PMOS level shifter transistors 64 and 66 are thin oxide FET devices.

As to the first NMOS level shifter transistor 68 and the second NMOS level shifter transistor 70, with the input signal PAD_IN at the low voltage level, such as 0 V, the first NMOS level shifter transistor 68 is biased off and the second NMOS level shifter transistor 70 is biased on to provide the low voltage level at the input signal PAD_IN to the gate of the first NMOS transistor 52. This biases off the first NMOS transistor 52. Also, with the output 56 at or near the I/O power supply voltage VDDIO, such as 1.2 V, and the gate of the second NMOS transistor 54 at the core power supply voltage VDDC, such as 0.75 V, the second NMOS transistor 54 is biased off. With the voltage level at the drain/source of the first NMOS level shifter transistor 68 and at the gate of the second NMOS level shifter transistor 70 at the device core power supply voltage VDDC, the first and second NMOS level shifter transistors 68 and 70 are not damaged by the drain/source to gate voltage levels, even if the first and second NMOS level shifter transistors 68 and 70 are thin oxide FET devices.

As to the hysteresis control circuit 202, the high voltage at the output 56 biases off the first PMOS level shifter transistor 210 and biases on the second PMOS level shifter transistor 212 to provide the high voltage at the output 56 to the gate of the PMOS hysteresis feedback transistor 204. This biases off the PMOS hysteresis feedback transistor 204 and the cascode PMOS transistor 206. The high voltage at the output 56 biases on the first NMOS level shifter transistor 220 and biases off the second NMOS level shifter transistor 222, which provides the core power supply voltage VDDC to the gate of the NMOS hysteresis feedback transistor 214, which biases on the NMOS hysteresis feedback transistor 214 and the cascode NMOS transistor 216 to provide a higher voltage to the connection between the first and second NMOS transistors 52 and 54. With the voltage level at the gate of the second NMOS transistor 54 at the device core power supply voltage VDDC and the output 56 at the I/O power supply voltage VDDIO, the second NMOS transistor 54 is not damaged by the drain/source to gate voltage level, even if the second NMOS transistor 54 is a thin oxide FET device. Also, the first NMOS transistor 52 is not damaged by the drain/source to gate voltage level, even if the first NMOS transistor 52 is a thin oxide FET device.

When the input signal PAD_IN switches from a low voltage, such as 0 V, to a high voltage, such as 1.2 V, the first PMOS level shifter transistor 64 is biased off and the second PMOS level shifter transistor 66 is biased on to provide the high voltage of the input signal PAD_IN to the gate of the first PMOS transistor 48, which biases off the first PMOS transistor 48. Also, the output 56 switches to a low voltage level, such as 0 V, and the second PMOS transistor 50 is biased off. With the voltage level at the drain/source of the first PMOS level shifter transistor 64 and at the gate of the second PMOS level shifter transistor 66 at the high level reference voltage VSSH, the first and second PMOS level shifter transistors 64 and 66 are not damaged by the drain/source to gate voltage levels, even if the first and second PMOS level shifter transistors 64 and 66 are thin oxide FET devices.

Also, with the input signal PAD_IN at the high voltage level, the second NMOS level shifter transistor 70 is biased off and the first NMOS level shifter transistor 68 is biased on to provide the device core power supply voltage VDDC to the gate of the first NMOS transistor 52. The first NMOS transistor 52 is biased on and the second NMOS transistor 54 is biased on, but only after the input signal PAD_IN has risen to a high enough voltage level and the connection between the first and second NMOS transistors 52 and 54 has dropped to a low enough voltage level to bias on the second NMOS transistor 54 and provide a low voltage level that is near the reference VSS 58 to the output 56. Having the higher voltage at the connection between the first and second NMOS transistors 52 and 54, results in a higher input voltage level at the input signal PAD_IN for switching the output 56 from the high voltage level that is near the I/O power supply voltage VDDIO, such as 1.2 V, to the low voltage level that is near the reference VSS 58, such as 0 V.

With the voltage levels at the gates of the first and second NMOS transistors 52 and 54 at the core power supply voltage VDDC, neither of the first and second NMOS transistors 52 and 54 is damaged by the drain/source to gate voltage levels, even if the first and second NMOS transistors 52 and 54 are thin oxide FET devices. Also, with the voltage level at the drain/source of the first NMOS level shifter transistor 68 and at the gate of the second NMOS level shifter transistor 70 at the core power supply voltage VDDC, the first and second NMOS level shifter transistors 68 and 70 are not damaged by the drain/source to gate voltage levels, even if the first and second NMOS level shifter transistors 68 and 70 are thin oxide FET devices.

As to the hysteresis control circuit 202, the low voltage at the output 56 biases on the first PMOS level shifter transistor 210 and biases off the second PMOS level shifter transistor 212, which provides the high level reference voltage VSSH to the gate of the PMOS hysteresis feedback transistor 204. This biases on the PMOS hysteresis feedback transistor 204 and the cascode PMOS transistor 206. The low voltage at the output 56 biases off the first NMOS level shifter transistor 220 and biases on the second NMOS level shifter transistor 222 to provide the low voltage at the output 56 to the gate of the NMOS hysteresis feedback transistor 214, which biases off the NMOS hysteresis feedback transistor 214 and the cascode NMOS transistor 216. With the voltage level at the gate of the second PMOS transistor 50 at the high level reference voltage VSSH and the output 56 at or near the reference VSS, the second PMOS transistor 50 is not damaged by the drain/source to gate voltage level, even if the second PMOS transistor 50 is a thin oxide FET device. Also, the first PMOS transistor 48 is not damaged by the drain/source to gate voltage level, even if the first PMOS transistor 48 is a thin oxide FET device.

When the input signal PAD_IN switches from the high voltage level to the low voltage level, the first NMOS level shifter transistor 68 is biased off and the second NMOS level shifter transistor 70 is biased on to provide the low voltage of the input signal PAD_IN to the gate of the first NMOS transistor 52, which biases off the first NMOS transistor 52, and with the output 56 at the high voltage level, the second NMOS transistor 54 is biased off. Also, the second PMOS level shifter transistor 66 is biased off and the first PMOS level shifter transistor 64 is biased on to provide the high level reference voltage VSSH to the gate of the first PMOS transistor 48. The first PMOS transistor 48 is biased on and the second PMOS transistor 50 is biased on, but only after the input signal PAD_IN has dropped to a low enough voltage level and the connection between the first and second PMOS transistors 48 and 50 has risen to a high enough voltage level to bias on the second PMOS transistor 50, which provides a high voltage level near the I/O power supply voltage VDDIO to the output 56. Having the PMOS hysteresis feedback transistor 204 provide a lower voltage to the connection between the first and second PMOS transistors 48 and 50, results in a lower input voltage at the input signal PAD_IN for biasing on first and second PMOS transistors 48 and 50 to switch the output 56 from the low voltage level near the reference VSS 58, such as 0 V, to the high voltage level near the I/O power supply voltage VDDIO, such as 1.2 V.

When switching the input signal PAD_IN from a low voltage level to a high voltage level, having a higher voltage at the connection between the first and second NMOS transistors 52 and 54 results in a higher input voltage level for switching the output 56 from the high voltage level that is near the I/O power supply voltage VDDIO to the low voltage level that is near the reference VSS 58, and when switching the input signal PAD_IN from a high voltage level to a low voltage level, having a lower voltage at the connection between the first and second PMOS transistors 48 and 50, results in a lower input voltage level for switching the output 56 from the low voltage level that is near the reference VSS 58 to the high voltage level that is near the I/O power supply voltage VDDIO. This results in different transition input threshold voltages ViH and ViL in the input signal PAD_IN, which provides the hysteresis window and better noise immunity than a simple inverter.

In the Schmitt trigger 200, the high-side output level shifter 208 and the low-side output level shifter 218 in the hysteresis feedback loop of the hysteresis control circuit 202 isolate the high-side and the low-side voltage swings. This reduces variations in the size of the hysteresis window caused by the IO power supply voltage VDDIO and the core voltages, including the core power supply voltage VDDC and high level reference voltage VSSH, having different voltage spreads.

Also, in the Schmitt trigger 200, the gate of the cascode PMOS transistor 206 is biased to the high level reference voltage VSSH, such that the cascode PMOS transistor 206 protects the PMOS hysteresis feedback transistor 204 from being overstressed. Also, the gate of the cascode NMOS transistor 216 is biased to the core power supply voltage VDDC, such that the cascode NMOS transistor 216 protects the NMOS hysteresis feedback transistor 214 from being overstressed.

Figure 7:
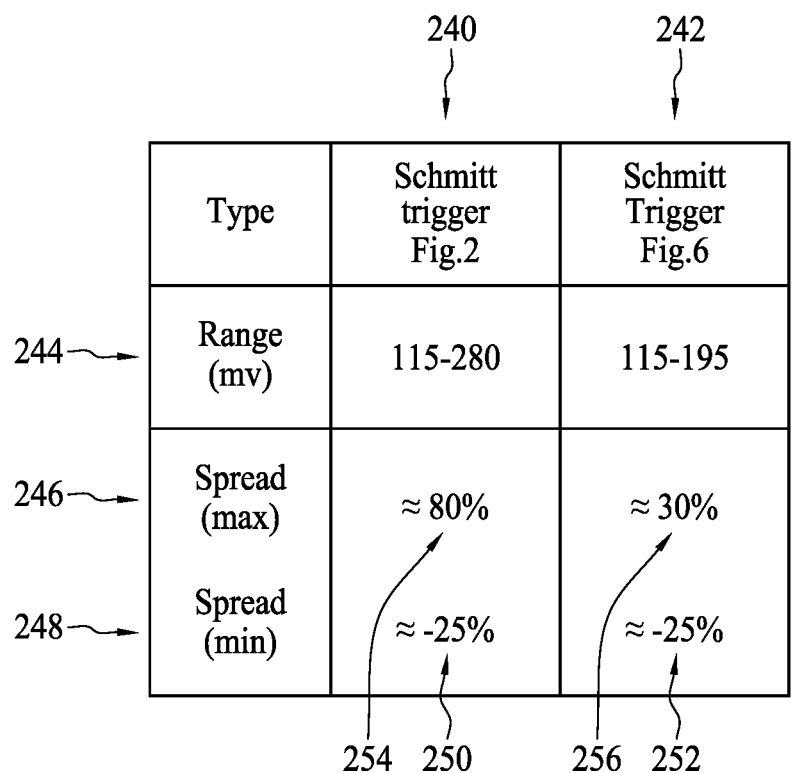
FIG. 7 is a table diagram schematically illustrating a reduction in the spread or variation in the size of hysteresis windows from the Schmitt trigger of FIG. 2 to the Schmitt trigger of FIG. 6, in accordance with some embodiments.

FIG. 7 is a table diagram schematically illustrating a reduction in the spread or variation in the size of hysteresis windows from the Schmitt trigger 22 of FIG. 2 to the Schmitt trigger 200 of FIG. 6, in accordance with some embodiments.

In the present example, the table includes information at 240 for the Schmitt trigger 22 of FIG. 2 and information at 242 for the Schmitt trigger 200 of FIG. 6. Ranges for the size of the hysteresis windows 244, in milli-volts (mV), are indicated at row 244, maximum spreads (spread (max)) are indicated at row 246, and minimum spreads (spread (min)) are indicated at row 248.

The maximum spreads (spread (max)) at row 246 are the maximum hysteresis voltages divided by a typical hysteresis voltage. The minimum spreads (spread (min)) at row 248 are the minimum hysteresis voltages divided by the typical hysteresis voltage.

The minimum spread (spread (min)) for the Schmitt trigger 22 of FIG. 2 at 250 is about −25% and the minimum spread (spread (min)) for the Schmitt trigger 200 of FIG. 6 at 252 is about −25%. The maximum spread (spread (max)) for the Schmitt trigger 22 of FIG. 2 at 254 is about 80% and the maximum spread (spread (max)) for the Schmitt trigger 200 of FIG. 6 at 256 is about 30%, or a reduction of about 50%. Thus, the hysteresis spread or variation is reduced from a range of [−25% to 80%] to a range of [−25% to 30%].

In some embodiments, the Schmitt trigger 22 of FIG. 2 is made with only thin oxide FET devices and the Schmitt trigger 200 of FIG. 6 is made with only thin oxide FET devices.

Figure 8:
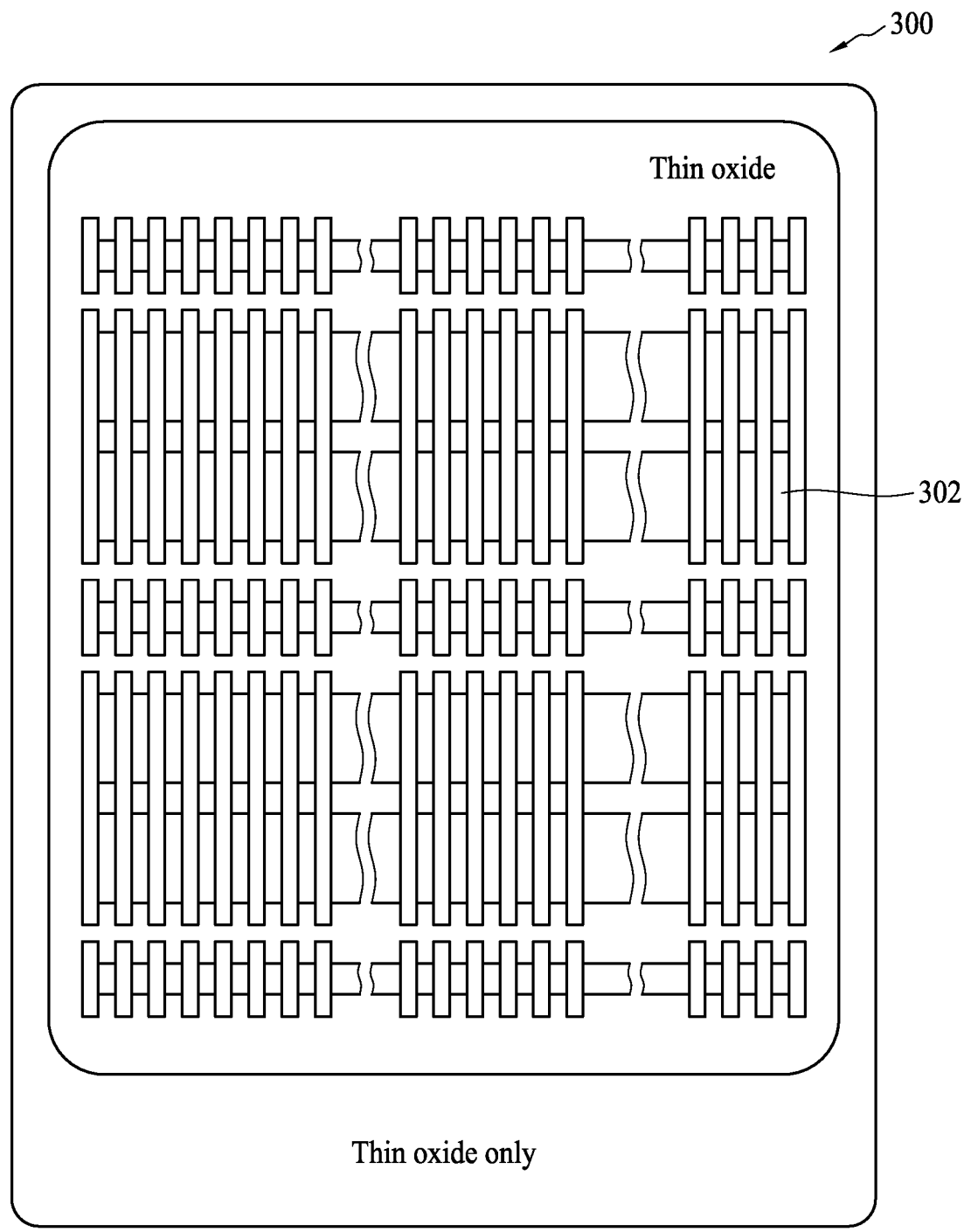
FIG. 8 is a diagram schematically illustrating an integrated circuit that includes only thin oxide FET devices, in accordance with some embodiments.

FIG. 8 is a diagram schematically illustrating an integrated circuit 300 that includes only thin oxide FET devices 302, in accordance with some embodiments. The integrated circuit 300 does not include thick oxide FET devices, such that the integrated circuit 300 can be made smaller with the thin oxide FET devices and the absence of a keep out zone between thick oxide FET devices and thin oxide FET devices. In some embodiments, the integrated circuit 300 includes the I/O interface 20 of FIG. 1. In some embodiments, the integrated circuit 300 includes the Schmitt trigger 22 of FIG. 2 made with only thin oxide FET devices. In some embodiments, the integrated circuit 300 includes the Schmitt trigger 200 of FIG. 6 made with only thin oxide FET devices.

Advantages of the integrated circuit 300 having only/all thin oxide FET devices 302 include: a compact layout area; uniform channel lengths (Lg), such as the minimum channel length(s); better yields; less DGE; lower mismatch between matching transistors; and lower costs due to the lack of thick oxide FET devices.

Figure 9:
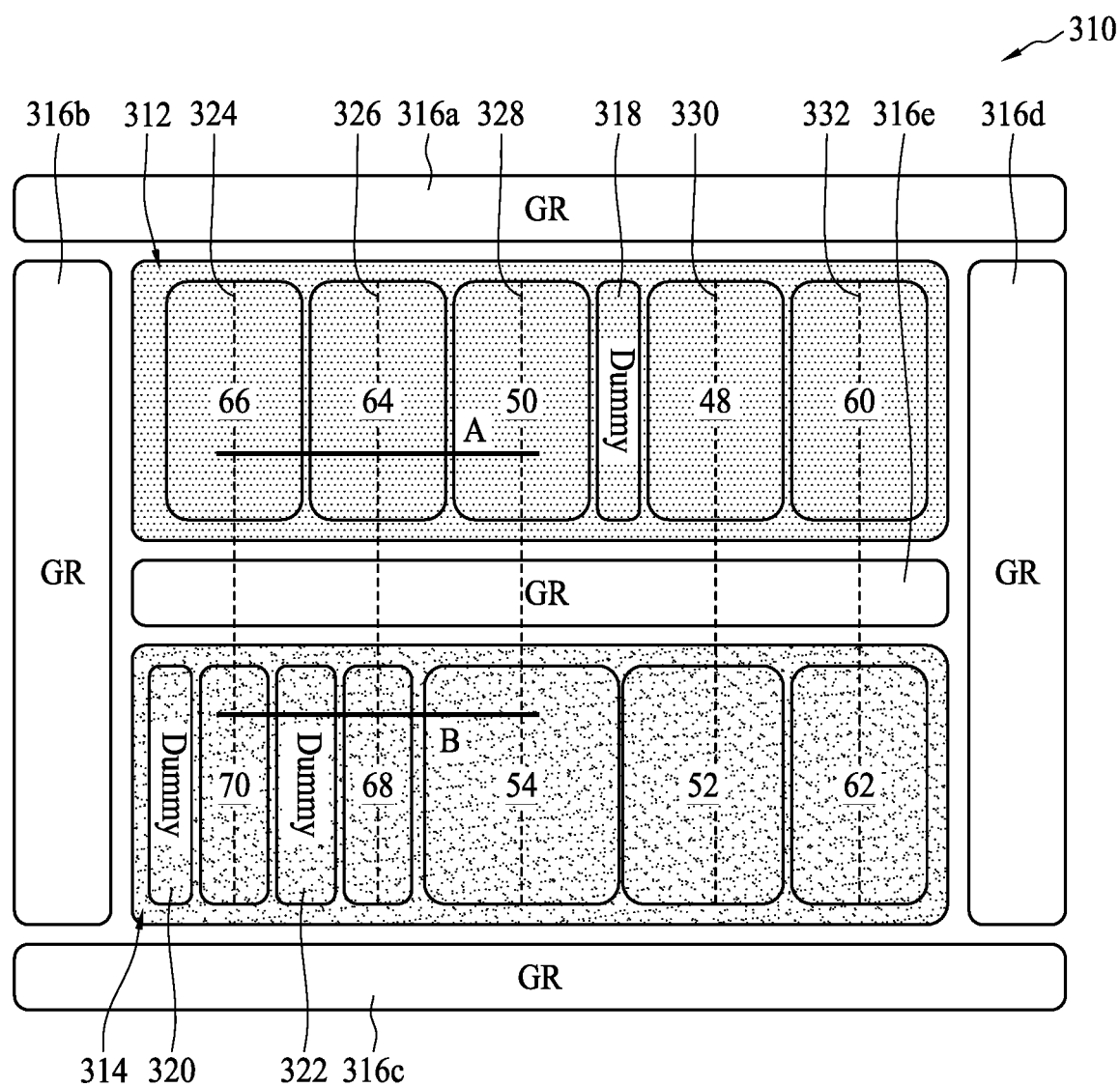
FIG. 9 is a diagram schematically illustrating an integrated circuit that includes the Schmitt trigger of FIG. 2 made with only thin oxide FET devices, in accordance with some embodiments.

FIG. 9 is a diagram schematically illustrating an integrated circuit 310 that includes the Schmitt trigger 22 of FIG. 2 made with only thin oxide FET devices, in accordance with some embodiments. The integrated circuit 310 includes a PMOS thin oxide FET device core 312, an NMOS thin oxide FET device core 314, and guard rings 316a-316e that surround the PMOS thin oxide FET device core 312 and the NMOS thin oxide FET device core 314. The PMOS thin oxide FET device core 312 is aligned in parallel with the NMOS thin oxide FET device core 314. The guard rings 316a-316e reduce or eliminate ESD latch-up risks from, for example, the I/O pad 30 in the I/O interface 20 of FIG. 1. In some embodiments, the integrated circuit 310 is like the integrated circuit 300 of FIG. 8.

The floor plan of the Schmitt trigger 22 includes the PMOS thin oxide FET devices 48, 50, 60, 64, and 66 laid out in the PMOS thin oxide FET device core 312 and the NMOS thin oxide FET devices 52, 54, 62, 68, and 70 laid out in the NMOS thin oxide FET device core 314. In the layout of the Schmitt trigger 22, the PMOS thin oxide FET devices 48, 50, 60, 64, and 66 and the NMOS thin oxide FET devices 52, 54, 62, 68, and 70 are laid out symmetrically to improve performance and provide a stable, symmetric hysteresis window. Also, pairs of the PMOS thin oxide FET devices 48, 50, 60, 64, and 66 and the NMOS thin oxide FET devices 52, 54, 62, 68, and 70 are centerline aligned to provide a symmetric layout, with dummy regions 318, 320, and 322 inserted as empty regions to centerline align the pairs of the PMOS thin oxide FET devices 48, 50, 60, 64, and 66 and the NMOS thin oxide FET devices 52, 54, 62, 68, and 70.

For example, the transistor pair of the second PMOS level shifter transistor 66 and the second NMOS level shifter transistor 70 at 324, the transistor pair of the first PMOS level shifter transistor 64 and the first NMOS level shifter transistor 68 at 326, the transistor pair of the second PMOS transistor 50 and the second NMOS transistor 54 at 328, the transistor pair of the first PMOS transistor 48 and the first NMOS transistor 52 at 330, and the transistor pair of the PMOS hysteresis feedback transistor 60 and the NMOS hysteresis feedback transistor 62 at 332 are centerline aligned to provide the symmetric layout. Also, matched routings for node A and node B are generated for better symmetry.

Figure 10:
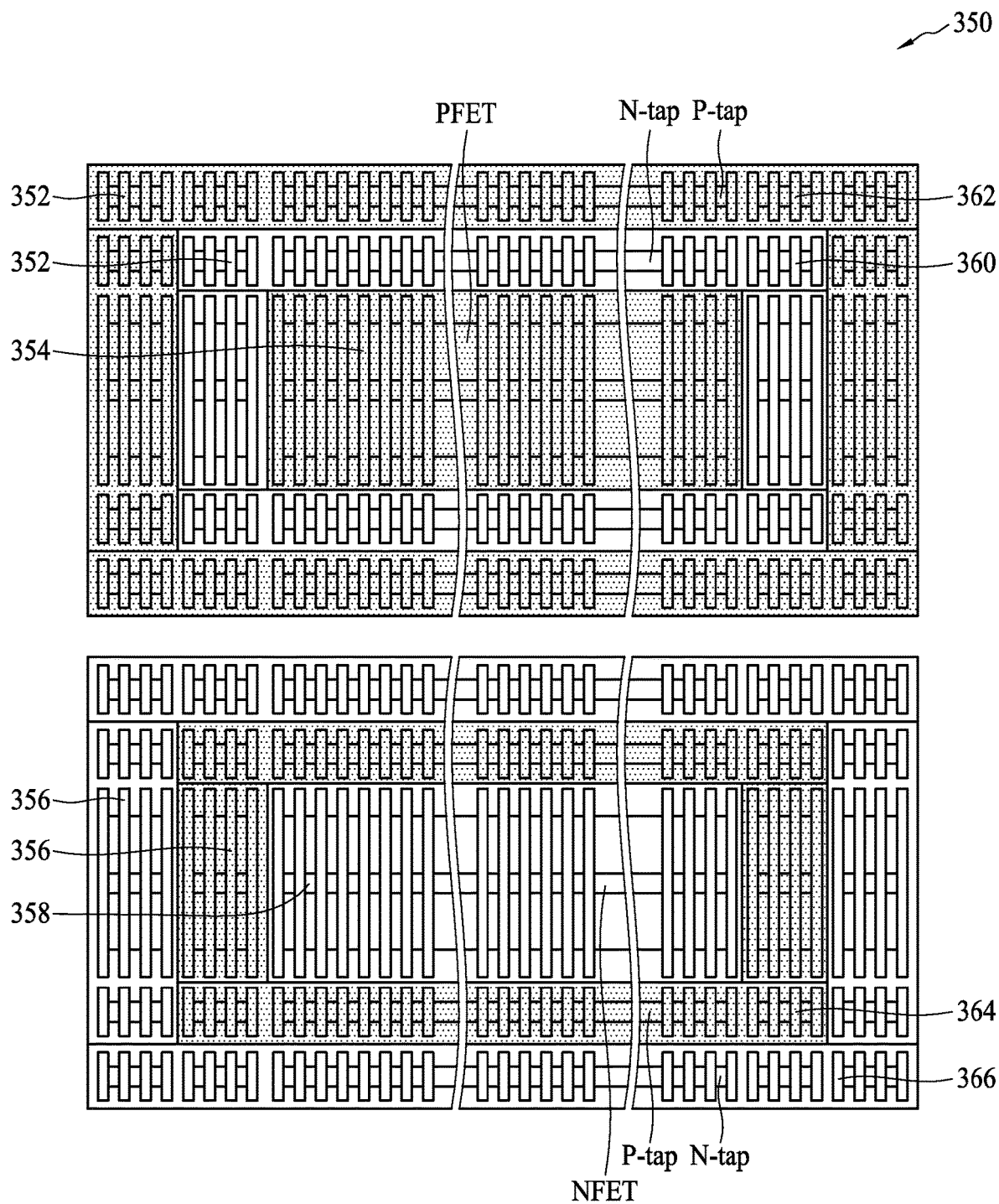
FIG. 10 is a diagram schematically illustrating an integrated circuit that includes double guard rings around a PMOS thin oxide FET device core, and double guard rings around an NMOS thin oxide FET device core, in accordance with some embodiments.

FIG. 10 is a diagram schematically illustrating an integrated circuit 350 that includes double guard rings 352 around a PMOS thin oxide FET device core 354, and double guard rings 356 around an NMOS thin oxide FET device core 358, in accordance with some embodiments. In some embodiments, the guard rings 316a-316e (shown in FIG. 9) are like the double guard rings 352 and 356. In some embodiments, the integrated circuit 310 of FIG. 9 is like the integrated circuit 350.

The double guard rings 352 include an N-tap guard ring 360 around the PMOS thin oxide FET device core 354 and a P-tap guard ring 362 around the N-tap guard ring 360. The double guard rings 356 include a P-tap guard ring 364 around the NMOS thin oxide FET device core 358 and an N-tap guard ring 366 around the P-tap guard ring 364. The double guard rings 352 and 356 reduce or eliminate the risk of ESD latch-up from, for example, the I/O pad 30 in the I/O interface 20 of FIG. 1.

Figure 11:
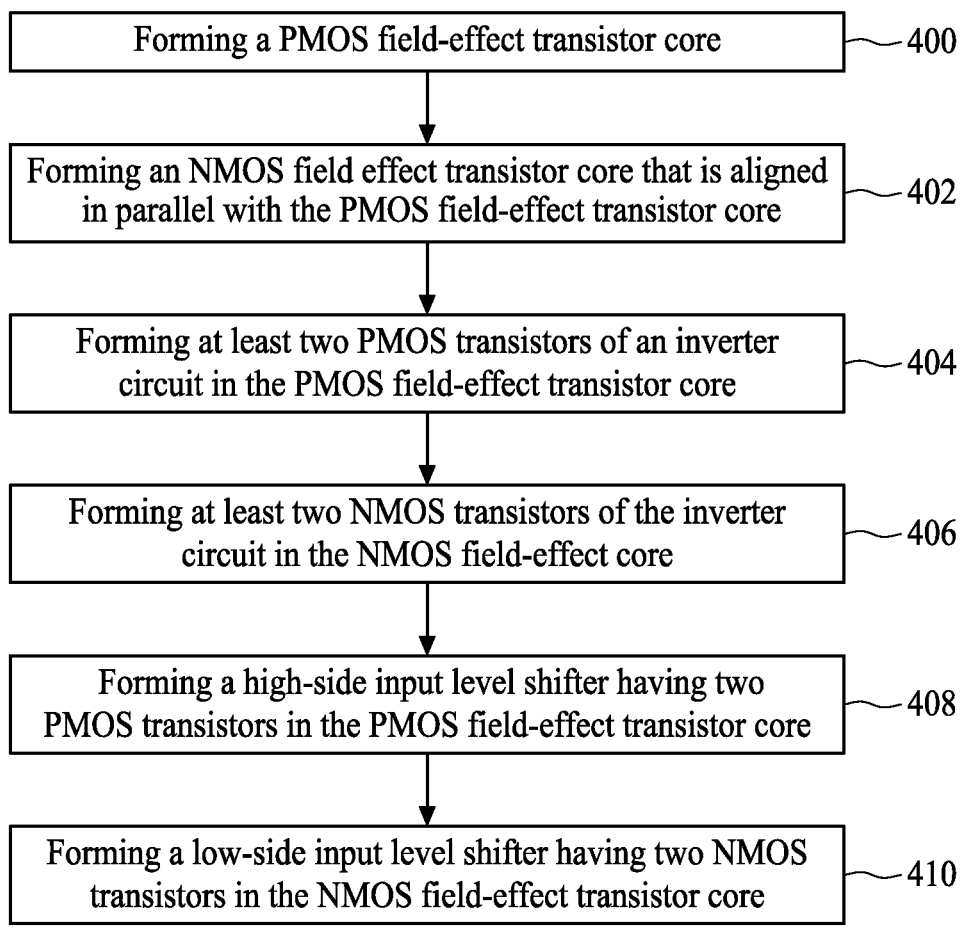
FIG. 11 is a flowchart diagram schematically illustrating a method of manufacturing an integrated circuit, in accordance with some embodiments.

FIG. 11 is a flowchart diagram schematically illustrating a method of manufacturing an integrated circuit, in accordance with some embodiments. In some embodiments, the integrated circuit is like the integrated circuit 300 of FIG. 8. In some embodiments, the integrated circuit is like the integrated circuit 310 of FIG. 9. In some embodiments, the integrated circuit is like the integrated circuit 350 of FIG. 10. In the following example, numeric indicators are taken from previous figures to enhance the description and not be limiting.

At 400, the method includes forming a PMOS field-effect transistor core 312, 354. In some embodiments, the method includes forming a first N-tap guard ring 360 around the PMOS field-effect transistor core 312, 354 and, in some embodiments, the method includes forming a first P-tap guard ring 362 around the first N-tap guard ring 360.

At 402, the method includes forming an NMOS field effect transistor core 314, 358 that is aligned in parallel with the PMOS field-effect transistor core 312, 354. In some embodiments, the method includes forming a second P-tap guard ring 364 around the NMOS field-effect transistor core 314, 358 and, in some embodiments, the method includes forming a second N-tap guard ring 366 around the second P-tap guard ring 364.

At 404, the method includes forming at least two PMOS transistors 48 and 50 of an inverter circuit 40 in the PMOS field-effect transistor core 312, 354 and, at 406, forming at least two NMOS transistors 52 and 54 of the inverter circuit 40 in the NMOS field-effect core 314, 358. In some embodiments, the inverter circuit 40 has an output 56 at a connection between the at least two NMOS transistors 52 and 54 and the at least two PMOS transistors 48 and 50. Also, in some embodiments, the at least two NMOS transistors 52 and 54 are centerline aligned with the at least two PMOS transistors 48 and 50, respectively.

At 408, the method includes forming a high-side input level shifter 44 having two PMOS transistors 64 and 66 in the PMOS field-effect transistor core 312, 354 and, at 410, forming a low-side input level shifter 46 having two NMOS transistors 68 and 70 in the NMOS field-effect transistor core 314, 358. In some embodiments, the at least two NMOS transistors 68 and 70 are centerline aligned with the at least two PMOS transistors 64 and 66, respectively.

In some embodiments, the method further includes forming a PMOS hysteresis control transistor 60, 204 in the PMOS field-effect transistor core 312, 354 and forming an NMOS hysteresis control transistor 62, 214 in the NMOS field-effect transistor core 314, 358. In some embodiments, the NMOS hysteresis control transistor 62, 214 is centerline aligned with the PMOS hysteresis control transistor 60, 204.

In some embodiments, the method includes forming a PMOS hysteresis feedback transistor 204 that has one drain/source region connected to a connection between the at least two PMOS transistors 48 and 50 and forming a PMOS cascode transistor 206 having one drain/source region connected to another drain/source region of the PMOS hysteresis feedback transistor 204 and another drain/source region of the PMOS cascode transistor 206 connected to a reference voltage VSS.

In some embodiments, the method includes forming a high-side output level shifter 208 connected to the output 56 and to a gate of the PMOS hysteresis feedback transistor 204 and, in some embodiments, the method includes forming a low-side output level shifter 218 connected to the output 56 and to a gate of the NMOS hysteresis feedback transistor 214.

Also, in some embodiments, forming the high-side output level shifter 208 includes forming a first PMOS transistor 210 having a first gate and having one drain/source region configured to receive a high level reference signal VSSH and another drain/source region connected to the gate of the PMOS hysteresis feedback transistor 204 and forming a second PMOS transistor 212 having a second gate and having one drain/source region connected to the output 56 and to the first gate of the first PMOS transistor 210 and another drain/source region connected to the gate of the PMOS hysteresis feedback transistor 204, the second gate of the second PMOS transistor 212 configured to receive the high level reference voltage VSSH.

In addition, in some embodiments, forming the low-side output level shifter 218 includes forming a first NMOS transistor 220 having a first gate and having one drain/source region configured to receive a core power supply voltage VDDC and another drain/source region connected to the gate of the NMOS hysteresis feedback transistor 214 and forming a second NMOS transistor 222 having a second gate and having one drain/source region connected to the output 56 and to the first gate of the first NMOS transistor 220 and another drain/source region connected to the gate of the NMOS hysteresis feedback transistor 214, the second gate of the second NMOS transistor 222 configured to receive the core power supply voltage VDDC.

Figure 12:
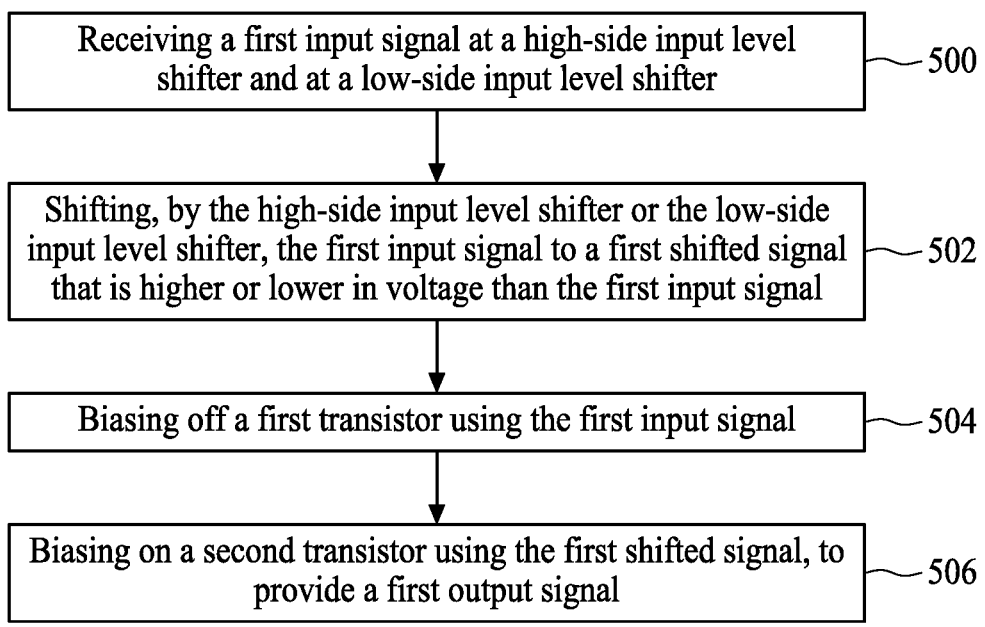
FIG. 12 is a flowchart diagram schematically illustrating a method of operation of a Schmitt trigger circuit, in accordance with some embodiments.

FIG. 12 is a flowchart diagram schematically illustrating a method of operation of a Schmitt trigger circuit, such as the Schmitt trigger 22 of FIG. 2 and the Schmitt trigger 200 of FIG. 6, in accordance with some embodiments.

At 500, the method includes receiving a first input signal PAD_IN at a high-side input level shifter 44 and at a low-side input level shifter 46. The first input signal PAD_IN can be a low voltage level input signal or a high voltage level input signal.

At 502, the method includes shifting, by the high-side input level shifter 44 or the low-side input level shifter 46, the first input signal PAD_IN to a first shifted signal that is higher or lower in voltage than the first input signal PAD_IN.

At 504, the method includes biasing off a first transistor, such as the PMOS transistor 48 or the NMOS transistor 52, using the first input signal PAD_IN and, at 506, the method includes biasing on a second transistor, such as the other one of the PMOS transistor 48 and the NMOS transistor 52, using the first shifted signal, to provide a first output signal OUT at the output 56.

In some embodiments, the method further includes receiving a second input signal PAD_IN at the high-side input level shifter 44 and at the low-side input level shifter 46, where the second input signal PAD_IN is the other one of the low voltage level input signal and the high voltage level input signal. Also, in some embodiments, the method includes: shifting, by the high-side input level shifter 44 or the low-side input level shifter 46, the second input signal PAD_IN to a second shifted signal that is higher or lower in voltage than the second input signal PAD_IN; biasing off the second transistor, which was biased on using the first shifted signal, using the second input signal PAD_IN; and biasing on the first transistor, which was biased off using the first input signal PAD_IN, using the second shifted signal, to provide a second output signal OUT at the output 56.

In some embodiments, the method further includes: receiving the first output signal OUT at a high-side output level shifter 208 and at a low-side output level shifter 218; shifting, by the high-side output level shifter 208 or the low-side output level shifter 218, the first output signal OUT to a first shifted output signal that is higher or lower in voltage than the first output signal OUT; biasing off a first hysteresis feedback transistor, such as hysteresis feedback transistor 204 or hysteresis feedback transistor 214, using the first output signal OUT; and biasing on a second hysteresis feedback transistor, such as the other one of the hysteresis feedback transistor 204 and the hysteresis feedback transistor 214, using the first shifted output signal, to provide hysteresis feedback control.

In some embodiments, the method further includes: receiving the second output signal OUT at the high-side output level shifter 208 and at the low-side output level shifter 218; shifting, by the high-side output level shifter 208 or the low-side output level shifter 218, the second output signal OUT to a second shifted output signal that is higher or lower in voltage than the second output signal OUT; biasing off the second hysteresis feedback transistor, which was biased on using the first shifted output signal, using the second output signal OUT; and biasing on the first hysteresis feedback transistor, which was biased off using the first output signal OUT, using the second shifted output signal, to provide hysteresis feedback control.

Disclosed embodiments thus provide a Schmitt trigger used in a mixed voltage I/O interface that receives an I/O power supply voltage VDDIO, a device core power supply voltage VDDC, and a high level reference voltage VSSH. In some embodiments, the Schmitt trigger is designed and manufactured using only thin oxide FET devices that are configured to be used in faster digital circuits, such as standard cell logic circuits, and to operate on lower voltages, such as the core device power supply voltage VDDC. In some embodiments, the Schmitt trigger is configured to fulfill the demands of I/O circuits in GAAFET devices and MBCFET devices, and in next generation technologies.

In other embodiments, the Schmitt trigger is designed and manufactured using thin oxide FET devices and thick oxide FET devices, where the thick oxide FET devices operate on higher voltages, such as the I/O power supply voltage VDDIO, without being damaged. In still other embodiments, the Schmitt trigger is designed and manufactured using only thick oxide FET devices.

Also, disclosed embodiments include a method of manufacturing an integrated circuit that includes forming a PMOS FET core with a first N-tap guard ring around the PMOS FET core and a first P-tap guard ring around the first N-tap guard ring, and forming an NMOS FET core that is aligned in parallel with the PMOS FET core and with a second P-tap guard ring around the NMOS FET core and a second N-tap guard ring around the second P-tap guard ring. In some embodiments, the method further includes forming at least two PMOS transistors of an inverter circuit in the PMOS FET core and forming at least two NMOS transistors of the inverter circuit in the NMOS FET core, where the at least two PMOS transistors are centerline aligned with the at least two NMOS transistors. In some embodiments, the method further includes forming a high-side level shifter having two PMOS transistors in the PMOS FET core and forming a low-side level shifter having two NMOS transistors in the NMOS FET core, wherein the two PMOS transistors are centerline aligned with the two NMOS transistors.

Advantages of the disclosed embodiments include providing a Schmitt trigger that includes only thin oxide FET devices, which eliminates problems associated with combining thick oxide FET devices and thin oxide FET devices on the same die. Also, providing a Schmitt trigger that includes only thin oxide FET devices, reduces costs by eliminating extra masks for the thick oxide FET devices and by reducing layout area, such as by eliminating keep out zones between thick oxide FET devices and thin oxide FET devices. Also, using only thin oxide FET devices in a circuit is layout and manufacturing friendly, where it provides more uniform patterns and densities that results in better yields, less DGE, and a lower mismatch between FETs.

In accordance with some embodiments, a device including an inverter circuit, a hysteresis control circuit, and a high-side input level shifter. The inverter circuit having an output and including at least two series connected PMOS transistors connected, at the output, in series to at least two series connected NMOS transistors. The hysteresis control circuit coupled to the output to provide feedback to the at least two series connected PMOS transistors and to the at least two series connected NMOS transistors. The high-side input level shifter connected to gates of the at least two PMOS transistors and configured to shift a low level of an input signal to a higher level and provide the higher level to one or more of the gates of the at least two PMOS transistors.

In accordance with further embodiments, a device including an inverter circuit and a first hysteresis control circuit. The inverter circuit having an output and including at least two series connected PMOS transistors connected, at the output, in series to at least two series connected NMOS transistors. The first hysteresis control circuit having a PMOS hysteresis feedback transistor that has one drain/source region connected to a connection between the at least two series connected PMOS transistors and another drain/source region connected to one drain/source region of a PMOS cascode transistor that has another drain/source region connected to a reference voltage. The first hysteresis control circuit further including a high-side output level shifter that includes a first PMOS transistor having a first gate and a second PMOS transistor having a second gate. The first PMOS transistor having one drain/source region connected to receive a high level reference signal and another drain/source region connected to the gate of the PMOS hysteresis feedback transistor. The second PMOS transistor having one drain/source region connected to the output and to the first gate of the first PMOS transistor and another drain/source region connected to the gate of the PMOS hysteresis feedback transistor, and the second gate of the second PMOS transistor connected to receive the high level reference voltage.

In accordance with still further disclosed aspects, a method of operation of a Schmitt Trigger circuit including: receiving a first input signal at a high-side input level shifter and at a low-side input level shifter; shifting, by the high-side input level shifter or the low-side input level shifter, the first input signal to a first shifted signal that is higher or lower in voltage than the first input signal; biasing off a first transistor using the first input signal; and biasing on a second transistor using the first shifted signal, to provide a first output signal.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
an inverter circuit having an output and including at least two series connected PMOS transistors connected, at the output, in series to at least two series connected NMOS transistors;
a hysteresis control circuit coupled to the output to provide feedback to the at least two series connected PMOS transistors and to the at least two series connected NMOS transistors; and
a high-side input level shifter connected to at least one gate of the at least two series connected PMOS transistors and configured to shift a low level of an input signal to a higher level and provide the higher level to one or more of the at least one gate of the at least two series connected PMOS transistors,
wherein the hysteresis control circuit includes a first hysteresis control circuit having a high-side output level shifter connected to a gate of a PMOS hysteresis feedback transistor that has one drain/source region connected to a connection between two series connected PMOS transistors of the at least two series connected PMOS transistors, the two series connected PMOS transistors having one gate connected to the high-side input level shifter and another gate connected to a high level reference voltage, and another drain/source region connected to one drain/source region of a PMOS cascode transistor that has another drain/source region directly connected to a reference voltage.

2. The device of claim 1, wherein the high-side input level shifter includes a first PMOS transistor having a first gate and a second PMOS transistor having a second gate, the first PMOS transistor having one drain/source region connected to receive the high level reference voltage and another drain/source region connected to the one gate of the at least two series connected PMOS transistors, the second PMOS transistor having one drain/source region connected to the one gate of the at least two series connected PMOS transistors and another drain/source region connected to the first gate of the first PMOS transistor and to receive the input signal, the second gate of the second PMOS transistor connected to receive the high level reference voltage.

3. The device of claim 1, wherein the at least two series connected PMOS transistors includes a first PMOS transistor and a second PMOS transistor, the first PMOS transistor having one drain/source region connected to receive an I/O power voltage and another drain source region connected to one drain/source region of the second PMOS transistor, another drain/source region of the second PMOS transistor connected to the output, and the one gate of the first PMOS transistor connected to the high-side input level shifter.

4. The device of claim 1, comprising:
a low-side input level shifter connected to at least one gate of the at least two series connected NMOS transistors and configured to shift a high level of the input signal to a lower level and provide the lower level to one or more of the at least one gate of the at least two series connected NMOS transistors.

5. The device of claim 4, wherein the low-side input level shifter includes a first NMOS transistor having a first gate and a second NMOS transistor having a second gate, the first NMOS transistor having one drain/source region connected to receive a core power voltage and another drain/source region connected to a gate of the at least two series connected NMOS transistors, the second NMOS transistor having one drain/source region connected to the gate of the at least two series connected NMOS transistors and another drain/source region connected to the first gate of the first NMOS transistor and to receive the input signal, the second gate of the second NMOS transistor connected to receive the core power voltage.

6. The device of claim 4, wherein the at least two series connected NMOS transistors includes a first NMOS transistor and a second NMOS transistor, the first NMOS transistor having one drain/source region connected to receive the reference voltage and another drain source region connected to one drain/source region of the second NMOS transistor, another drain/source region of the second NMOS transistor connected to the output, the gate of the first NMOS transistor connected to the low-side input level shifter.

7. The device of claim 1, wherein the high-side output level shifter is connected to the output and to the gate of the PMOS hysteresis feedback transistor.

8. The device of claim 7, wherein the high-side output level shifter includes a first PMOS transistor having a first gate and a second PMOS transistor having a second gate, the first PMOS transistor having one drain/source region connected to receive the high level reference voltage and another drain/source region connected to the gate of the PMOS hysteresis feedback transistor, the second PMOS transistor having one drain/source region connected to the output and to the first gate of the first PMOS transistor and another drain/source region connected to the gate of the PMOS hysteresis feedback transistor, the second gate of the second PMOS transistor connected to receive the high level reference voltage.

9. The device of claim 7, wherein the hysteresis control circuit comprises:
a second hysteresis control circuit having an NMOS hysteresis feedback transistor that has one drain/source region connected to a connection between the at least two series connected NMOS transistors and another drain/source region connected to one drain/source region of an NMOS cascode transistor that has another drain/source region directly connected to an I/O power voltage.

10. The device of claim 9, wherein the hysteresis control circuit comprises a low-side output level shifter connected to the output and to a gate of the NMOS hysteresis feedback transistor.

11. The device of claim 10, wherein the low-side output level shifter includes a first NMOS transistor having a first gate and a second NMOS transistor having a second gate, the first NMOS transistor having one drain/source region connected to receive a core power voltage and another drain/source region connected to the gate of the NMOS hysteresis feedback transistor, the second NMOS transistor having one drain/source region connected to the output and to the first gate of the first NMOS transistor and another drain/source region connected to the gate of the NMOS hysteresis feedback transistor, the second gate of the second NMOS transistor connected to receive the core power voltage.

12. A device, comprising:
an inverter circuit having an output and including at least two series connected PMOS transistors connected, at the output, in series to at least two series connected NMOS transistors; and
a first hysteresis control circuit having a PMOS hysteresis feedback transistor that has one drain/source region connected to a connection between two series connected PMOS transistors of the at least two series connected PMOS transistors, the two series connected PMOS transistors having one gate connected to a high-side input level shifter and another gate connected to a high level reference voltage, and another drain/source region connected to one drain/source region of a PMOS cascode transistor that has another drain/source region directly connected to a reference voltage, and a high-side output level shifter that includes a first PMOS transistor having a first gate and a second PMOS transistor having a second gate, the first PMOS transistor having one drain/source region connected to receive the high level reference signal and another drain/source region connected to a gate of the PMOS hysteresis feedback transistor, the second PMOS transistor having one drain/source region connected to the output and to the first gate of the first PMOS transistor and another drain/source region connected to the gate of the PMOS hysteresis feedback transistor, the second gate of the second PMOS transistor connected to receive the high level reference voltage.

13. The device of claim 12, comprising:
a second hysteresis control circuit having an NMOS hysteresis feedback transistor that has one drain/source region connected to a connection between the at least two series connected NMOS transistors and another drain/source region connected to one drain/source region of an NMOS cascode transistor that has another drain/source region directly connected to an I/O power voltage, and a low-side output level shifter connected to the output and to a gate of the NMOS hysteresis feedback transistor.

14. The device of claim 13, wherein the low-side output level shifter includes a first NMOS transistor having a first gate and a second NMOS transistor having a second gate, the first NMOS transistor having one drain/source region connected to receive a core power voltage and another drain/source region connected to the gate of the NMOS hysteresis feedback transistor, the second NMOS transistor having one drain/source region connected to the output and to the first gate of the first NMOS transistor and another drain/source region connected to the gate of the NMOS hysteresis feedback transistor, the second gate of the second NMOS transistor connected to receive the core power voltage.

15. The device of claim 12, comprising:
wherein the high-side input level shifter is connected to the one gate of the at least two PMOS transistors and configured to shift a low level of an input signal to a higher level and provide the higher level to the one gate of the at least two PMOS transistors; and
a low-side input level shifter connected to at least one gate of the at least two NMOS transistors and configured to shift a high level of the input signal to a lower level and provide the lower level to one or more of the at least one gate of the at least two NMOS transistors.

16. The device of claim 15, wherein the high-side input level shifter includes a first PMOS transistor having a first gate and a second PMOS transistor having a second gate, the first PMOS transistor having one drain/source region connected to receive a high level reference voltage and another drain/source region connected to the one gate of the at least two PMOS transistors, the second PMOS transistor having one drain/source region connected to the one gate of the at least two PMOS transistors and another drain/source region connected to the first gate of the first PMOS transistor and to receive the input signal, the second gate of the second PMOS transistor connected to receive the high level reference voltage.

17. A method of operation of a Schmitt Trigger circuit including:
  receiving a first input signal at a high-side input level shifter and at a low-side input level shifter;
  shifting, by the high-side input level shifter or the low-side input level shifter, the first input signal to a first shifted signal that is higher or lower in voltage than the first input signal;
  biasing off a first transistor using the first input signal;
  biasing on a second transistor using the first shifted signal, to provide a first output signal;
  receiving the first output signal at a high-side output level shifter and at a low-side output level shifter;
  shifting, by the high-side output level shifter or the low-side output level shifter, the first output signal to a first shifted output signal that is higher or lower in voltage than the first output signal;
  biasing off a first hysteresis feedback transistor using the first output signal; and
  biasing on a second hysteresis feedback transistor using the first shifted output signal, to provide hysteresis feedback control,
  wherein biasing off the first hysteresis feedback transistor or biasing on the second hysteresis feedback transistor comprises biasing a hysteresis feedback transistor that has one drain/source region connected to a connection between at least two series connected PMOS transistors and another drain/source region connected to one drain/source region of a PMOS cascode transistor that has another drain/source region directly connected to a reference voltage.

18. The method of claim 17, comprising:
  receiving a second input signal at the high-side input level shifter and at the low-side input level shifter;
  shifting, by the high-side input level shifter or the low-side input level shifter, the second input signal to a second shifted signal that is higher or lower in voltage than the second input signal;
  biasing off the second transistor using the second input signal; and
  biasing on the first transistor using the second shifted signal, to provide a second output signal.

19. The method of claim 18, comprising:
  receiving the second output signal at the high-side output level shifter and at the low-side output level shifter;
  shifting, by the high-side output level shifter or the low-side output level shifter, the second output signal to a second shifted output signal that is higher or lower in voltage than the second output signal;
  biasing off the second hysteresis feedback transistor using the second output signal; and
  biasing on the first hysteresis feedback transistor using the second shifted output signal, to provide hysteresis feedback control.

20. The method of claim 19, wherein biasing off the second hysteresis feedback transistor or biasing on the first hysteresis feedback transistor comprises biasing the hysteresis feedback transistor that has one drain/source region connected to a connection between at least two series connected PMOS transistors and another drain/source region connected to one drain/source region of a PMOS cascode transistor that has another drain/source region directly connected to a reference voltage.

* * * * *